US011411018B2

(12) United States Patent
Kim et al.

(10) Patent No.: US 11,411,018 B2
(45) Date of Patent: Aug. 9, 2022

(54) INTEGRATED CIRCUIT DEVICE

(71) Applicant: Samsung Electronics Co., Ltd., Suwon-si (KR)

(72) Inventors: Chanho Kim, Seoul (KR); Daeseok Byeon, Seongnam-si (KR); Dongku Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 16/923,636

(22) Filed: Jul. 8, 2020

(65) Prior Publication Data

US 2021/0091105 A1    Mar. 25, 2021

(30) Foreign Application Priority Data

Sep. 24, 2019    (KR) .................. 10-2019-0117491

(51) Int. Cl.
| | |
|---|---|
| *H01L 27/11573* | (2017.01) |
| *H01L 27/11519* | (2017.01) |
| *H01L 27/11524* | (2017.01) |
| *H01L 27/11556* | (2017.01) |
| *H01L 27/11529* | (2017.01) |
| *H01L 21/768* | (2006.01) |

(Continued)

(52) U.S. Cl.
CPC .. *H01L 27/11573* (2013.01); *H01L 21/76805* (2013.01); *H01L 21/76895* (2013.01); *H01L 23/535* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11582* (2013.01)

(58) Field of Classification Search
CPC .................................................. H01L 27/11573
See application file for complete search history.

(56) References Cited

U.S. PATENT DOCUMENTS

| | | | |
|---|---|---|---|
| 9,853,047 | B2 | 12/2017 | Choi |
| 9,960,173 | B2 | 5/2018 | Shimojo |

(Continued)

OTHER PUBLICATIONS

First Office Action dated Jan. 31, 2022 for corresponding DE Patent Application No. 102020111649.7.

*Primary Examiner* — Yu-Hsi D Sun
(74) *Attorney, Agent, or Firm* — Muir Patent Law, PLLC

(57) ABSTRACT

An integrated circuit (IC) device includes a peripheral circuit structure, a memory stack including a plurality of gate lines overlapping the peripheral circuit structure in a vertical direction on the peripheral circuit structure, an upper substrate between the peripheral circuit structure and the memory stack, the upper substrate including a through hole positioned below a memory cell region of the memory stack, a word line cut region extending lengthwise in a first lateral direction across the memory stack and the through hole, and a common source line located in the word line cut region, the common source line including a first portion extending lengthwise in the first lateral direction on the upper substrate and a second portion integrally connected to the first portion, the second portion penetrating the upper substrate through the through hole from an upper portion of the upper substrate and extending into the peripheral circuit structure.

20 Claims, 26 Drawing Sheets

(51) Int. Cl.
*H01L 27/1157* (2017.01)
*H01L 27/11582* (2017.01)
*H01L 23/535* (2006.01)
*H01L 27/11565* (2017.01)

(56) References Cited

U.S. PATENT DOCUMENTS

| | | |
|---|---|---|
| 9,960,181 B1 | 5/2018 | Cui et al. |
| 10,276,586 B2 | 4/2019 | Murakoshi et al. |
| 2016/0163732 A1 | 6/2016 | Lim et al. |
| 2017/0179153 A1 | 6/2017 | Ogawa et al. |
| 2019/0051665 A1 | 2/2019 | Yun et al. |
| 2019/0081053 A1 | 3/2019 | Nojima et al. |
| 2019/0081062 A1* | 3/2019 | Wada ................. H01L 27/11568 |
| 2019/0115357 A1 | 4/2019 | Oh et al. |
| 2019/0267333 A1* | 8/2019 | Hong ................. H01L 27/11582 |
| 2021/0343342 A1* | 11/2021 | Lee .................... G11C 16/0483 |

* cited by examiner

INTEGRATED CIRCUIT DEVICE

CROSS-REFERENCE TO RELATED APPLICATIONS

This application claims the benefit of priority to Korean Patent Application No. 10-2019-0117491, filed on Sep. 24, 2019, in the Korean Intellectual Property Office, the disclosure of which is incorporated herein in its entirety by reference.

BACKGROUND

The inventive concept relates to an integrated circuit (IC) device, and more particularly, to an IC device including a non-volatile memory device having a cell over periphery (COP) structure.

With the multi-functionalization of information communication devices, high-capacity highly integrated IC devices including memory devices have been required more and more, memory cells have gradually been downscaled, and operating circuits and interconnection structures, which are included in the memory devices to enable operations and electrical connection of the memory devices, have become complicated. Accordingly, there is a need for an IC device including a memory device, which is configured to improve an integration density and have good electrical characteristics.

SUMMARY

The disclosed embodiments provide an integrated circuit (IC) device, which has an improved integration density and a reduced chip size and is configured to increase a degree of freedom for layout design and improve the reliability of an interconnection structure.

According to an aspect of the inventive concept, there is provided an IC device including a peripheral circuit structure, a memory stack including a plurality of gate lines overlapping the peripheral circuit structure in a vertical direction on the peripheral circuit structure, an upper substrate between the peripheral circuit structure and the memory stack, the upper substrate including a through hole positioned below a memory cell region of the memory stack, a word line cut region extending lengthwise in a first lateral direction across the memory stack and the through hole, and a common source line located in the word line cut region, the common source line including a first portion extending lengthwise in the first lateral direction on the upper substrate and a second portion integrally connected to the first portion, the second portion penetrating the upper substrate through the through hole from an upper portion of the upper substrate and extending into the peripheral circuit structure.

According to an aspect of the inventive concept, there is provided an IC device including a peripheral circuit structure including a plurality of circuits, a plurality of peripheral circuit conductive interconnection layers connected to the plurality of circuits, and a floating conductive interconnection layer laterally spaced apart from the plurality of peripheral circuit conductive interconnection layers, an upper substrate located on the peripheral circuit structure, the upper substrate including a first through hole formed at a position overlapping the floating conductive interconnection layer in a vertical direction, a memory stack having a memory cell region covering the first through hole and a connection stepped region located at one side of the memory cell region, the memory stack including a plurality of gate lines spaced apart from the peripheral circuit structure with the upper substrate therebetween in the vertical direction, a plurality of word line cut regions extending lengthwise in a first lateral direction across the memory stack and the first through hole, the plurality of word line cut regions each including a portion penetrating the upper substrate through the first through hole in the vertical direction, and a plurality of first through electrodes penetrating the plurality of gate lines in the vertical direction in the memory cell region and extending to the plurality of peripheral circuit conductive interconnection layers through the first through hole.

According to an aspect of the inventive concept, there is provided an IC device including a peripheral circuit structure including a lower substrate and a plurality of peripheral circuit conductive interconnection layers and a floating conductive interconnection layer, which are formed on the lower substrate, a memory cell region including a plurality of gate lines arranged on the peripheral circuit structure, an upper substrate between the peripheral circuit structure and the memory cell region and including a through hole formed at a position within the memory cell region, a common source line including a first portion and a second portion, the first portion extending lengthwise in a first lateral direction across the memory cell region and the through hole, the first portion contacting the upper substrate, the second portion being integrally connected to the first portion and extending from an upper portion of the upper substrate through the through hole to the floating conductive interconnection layer, an insulating structure passing through the plurality of gate lines in the memory cell region and extending in the vertical direction, a buried insulating film filling the through hole, and at least one through electrode passing through the insulating structure and the buried insulating film and extending lengthwise in the vertical direction to at least one peripheral circuit conductive interconnection layer selected from the plurality of peripheral circuit conductive interconnection layers.

BRIEF DESCRIPTION OF THE DRAWINGS

Embodiments of the inventive concept will be more clearly understood from the following detailed description taken in conjunction with the accompanying drawings in which:

FIGS. 15A to 19A and to 15B to 19B are cross-sectional views illustrating a process sequence of a method of manufacturing an IC device, according to an embodiment, wherein FIGS. 15A-19A are cross-sectional views of some components according to the process sequence in a portion corresponding to a cross-section taken along a line X1-X1' of FIG. 4, and FIG. 15B-19B are cross-sectional views of some components according to the process sequence in the portion corresponding to a cross-section taken along a line Y1-Y1' of FIG. 4.

DETAILED DESCRIPTION OF THE EMBODIMENTS

Figure 1:
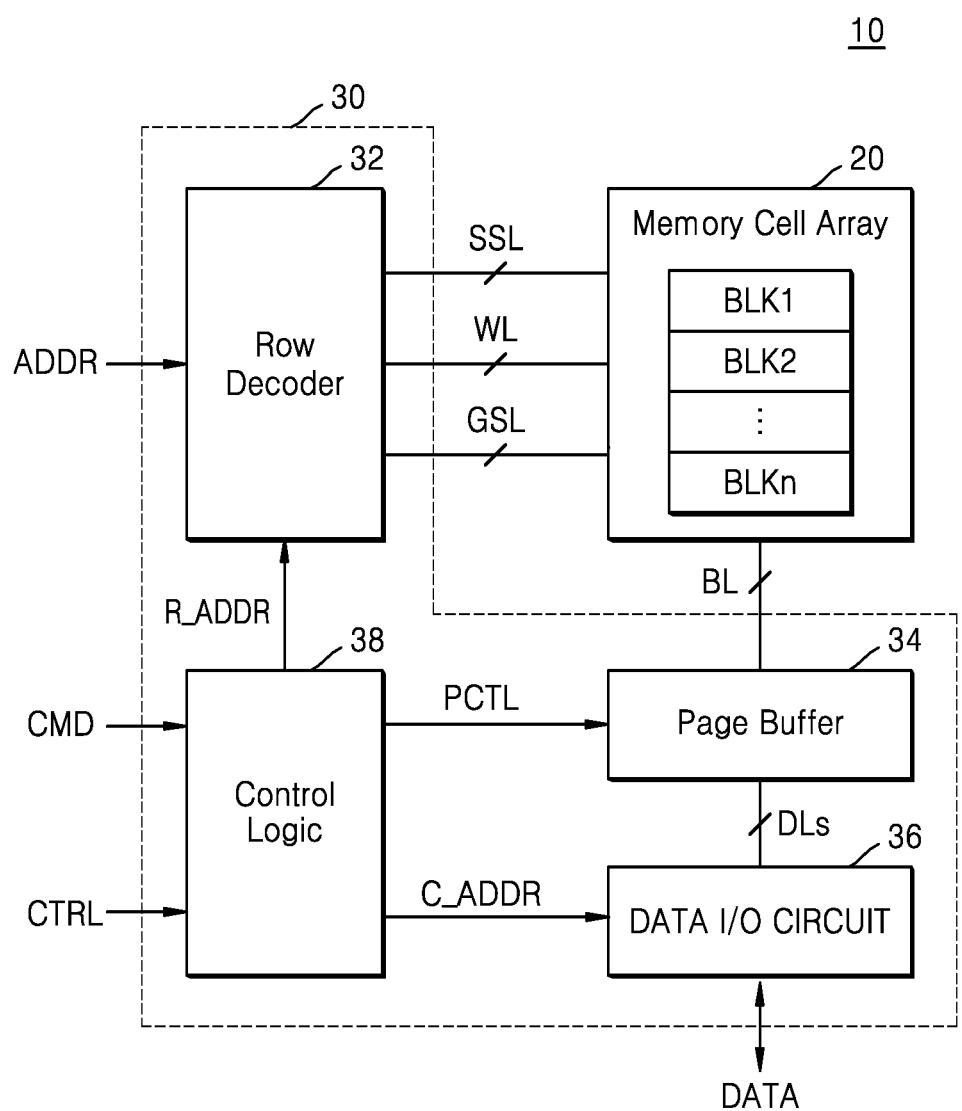
FIG. 1 is a block diagram of an integrated circuit (IC) device according to an embodiment.

Embodiments will now be described more fully with reference to the accompanying drawings in which some embodiments are shown. The same reference numerals are used to denote the same elements throughout the drawings, repeated descriptions thereof will be omitted.

FIG. 1 is a block diagram of an integrated circuit (IC) device 10 according to an embodiment.

Referring to FIG. 1, the IC device 10 may include a memory cell array 20 and a peripheral circuit 30. The memory cell array 20 may include a plurality of memory cell blocks BLK1, BLK2, . . . , and BLKn. Each of the plurality of memory cell blocks BLK1, BLK2, . . . , and BLKn may include a plurality of memory cells. The memory cell blocks BLK1, BLK2, . . . , and BLKn may be connected to the peripheral circuit 30 through a bit line BL (e.g., a plurality of bit lines), a word line WL (e.g., a plurality of word lines), a string selection line SSL (e.g., a plurality of string selection lines), and a ground selection line GSL (e.g., a plurality of ground select lines).

The peripheral circuit 30 may include a row decoder 32, a page buffer 34, a data input/output (I/O) circuit 36, and a control logic 38. Although not shown in FIG. 1, the peripheral circuit 30 may further include an input/output (I/O) interface, a column logic, a voltage generator, a pre-decoder, a temperature sensor, a command decoder, an address decoder, and an amplification circuit.

The memory cell array 20 may be connected to the page buffer 34 through the bit line BL and connected to the row decoder 32 through the word line WL, the string selection line SSL, and the ground selection line GSL. In the memory cell array 20, each of the plurality of memory cells included in each of the plurality of memory cell blocks BLK1, BLK2, . . . , and BLKn may be a flash memory cell. The memory cell array 20 may be a three-dimensional (3D) memory cell array. The 3D memory cell array may include a plurality of NAND strings, each of which may include memory cells respectively connected to a plurality of word lines WL vertically stacked on a substrate. In example embodiments, the memory cell array 20 may include a memory stack MS, which will be described below with reference to FIGS. 4 and 5B.

The peripheral circuit 30 may receive an address ADDR, a command CMD, and a control signal CTRL from the outside of the IC device 10 and transmit and receive data DATA to and from a device located outside the IC device 10. The IC device may be, for example, a semiconductor chip such as a memory chip.

The row decoder 32 may select at least one of the plurality of memory cell blocks BLK1, BLK2, . . . , and BLKn in response to the address ADDR received from the outside, and select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 through the bit line BL. During a program operation, the page buffer 34 may operate as a write driver and apply a voltage corresponding to data DATA to be stored in the memory cell array 20 to the bit line BL. During a read operation, the page buffer 34 may operate as a sense amplifier and sense data DATA stored in the memory cell array 20. The page buffer 34 may operate in response to a control signal PCTL provided from the control logic 38.

The data I/O circuit 36 may be connected to the page buffer 34 through data lines DLs. During a program operation, the data I/O circuit 36 may receive data DATA from a memory controller (not shown) and provide program data DATA to the page buffer 34 based on a column address C_ADDR provided from the control logic 38. During a read operation, the data I/O circuit 36 may provide read data DATA stored in the page buffer 34 to the memory controller based on the column address C_ADDR provided from the control logic 38.

The data I/O circuit 36 may transmit a received address or instruction to the control logic 38 or the row decoder 32. The peripheral circuit 30 of the IC device 10 may further include an electrostatic discharge (ESD) circuit and a pull-up/pull-down driver.

The control logic 38 may receive a command CMD and a control signal CTRL from the memory controller. The control logic 38 may provide a row address R_ADDR to the row decoder 32 and provide the column address C_ADDR to the data I/O circuit 36. The control logic 38 may generate various internal control signals used in the IC device 10 in response to the control signal CTRL. For example, the control logic 38 may adjust voltage levels provided to the word line WL and the bit line BL during a memory operation, such as a program operation or an erase operation.

Figure 2:
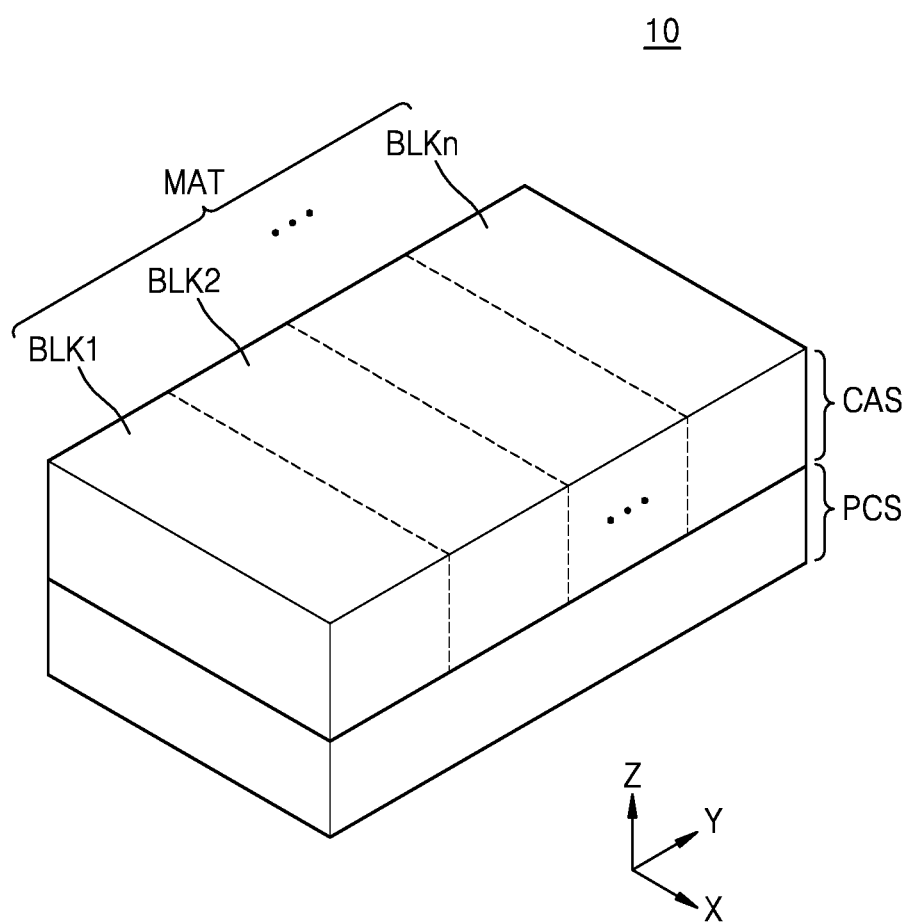
FIG. 2 is a schematic perspective view of an IC device according to an embodiment.

FIG. 2 is a perspective view of an IC device 10 according to an embodiment.

Referring to FIG. 2, the IC device 10 may include a cell array structure CAS and peripheral circuit structure PCS, which overlap each other (e.g., are overlaid) in a vertical direction (Z direction). The cell array structure CAS may include the memory cell array 20 described with reference to FIG. 1. The peripheral circuit structure PCS may include the peripheral circuit 30 described with reference to FIG. 1. The cell array structure CAS may be described as a cell array layer, and the peripheral circuit structure PCS may be described as a peripheral circuit layer. The cell array layer may be formed on (e.g., stacked on, in the vertical direction) the peripheral circuit layer, and each of the cell array layer and the peripheral circuit layer may include various components that form sub-layers.

The cell array structure CAS may include at least one mat MAT, each of which may include a plurality of memory cell blocks BLK1, BLK2, . . . , and BLKn. Each of the plurality of memory cell blocks BLK1, BLK2, . . . , and BLKn may include memory cells, which are three-dimensionally arranged.

Figure 3:
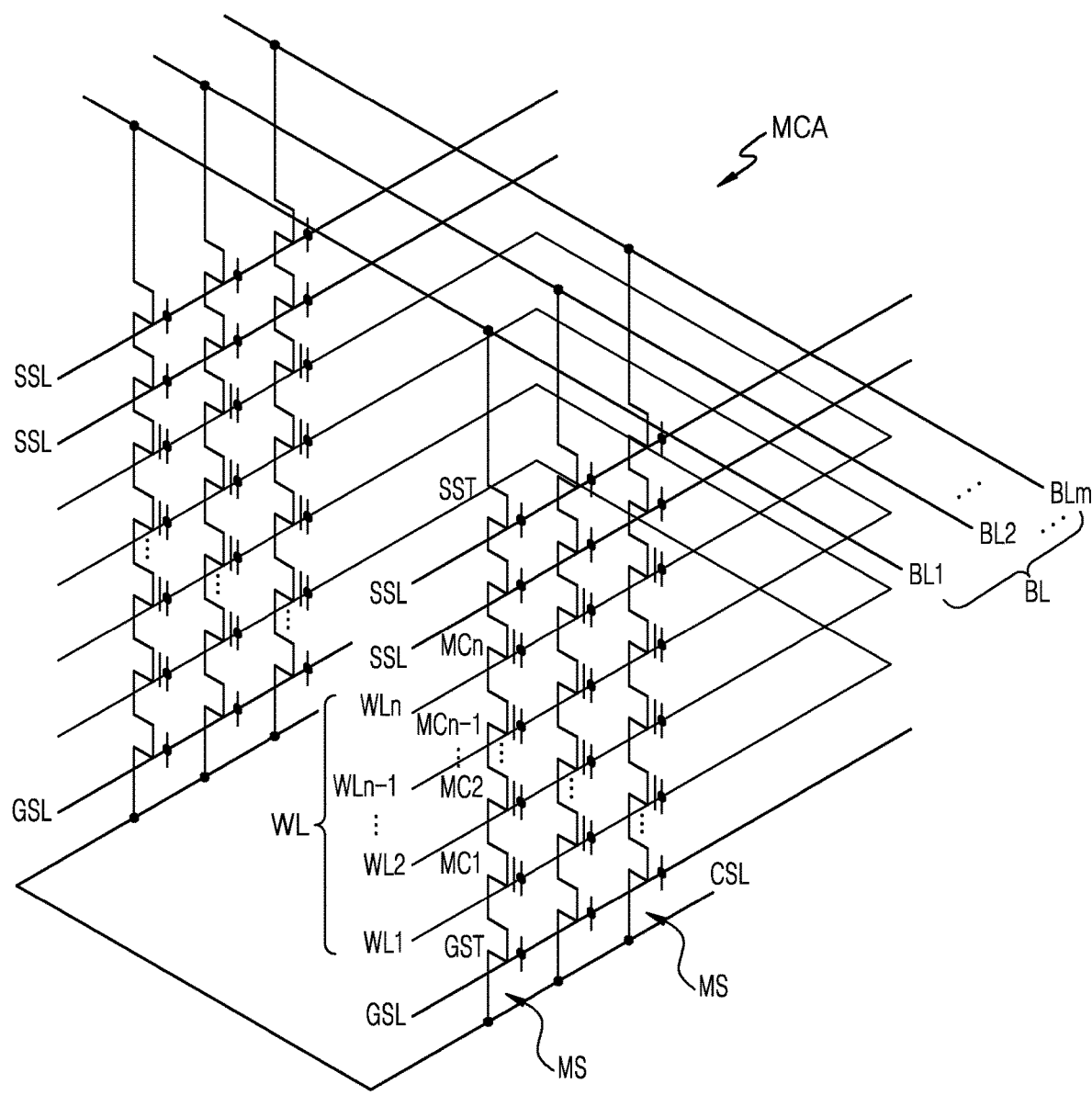
FIG. 3 is an equivalent circuit diagram of a memory cell array of an IC device according to an embodiment.

FIG. 3 is an equivalent circuit diagram of a memory cell array MCA of an IC device according to an embodiment. An equivalent circuit diagram of a vertical NAND (V-NAND) flash memory device having a vertical channel structure is exemplarily illustrated in FIG. 3. Each of the plurality of memory cell block BLK1, BLK2, . . . , and BLKn shown in FIG. 2 may include the memory cell array MCA shown in FIG. 3.

Referring to FIG. 3, the memory cell array MCA may include a plurality of memory cell strings MS. The memory cell array MCA may include a plurality of bit lines BL (or BL1, BL2, . . . , and BLm), a plurality of word lines WL (or WL1, WL2, . . . , WLn−1, and WLn), at least one string selection line SSL, at least one ground selection line GSL, and a common source line CSL. The plurality of memory cell strings MS may be formed between the plurality of bit lines BL (or BL1, BL2, . . . , and BLm) and the common source line CSL.

Each of the plurality of memory cell strings MS may include a string selection transistor SST, a ground selection transistor GST, and a plurality of memory cell transistors MC1, MC2, . . . , MCn−1, and MCn. Drain regions of a plurality of string selection transistors SST may be connected to the bit lines BL (or BL1, BL2, . . . , and BLm), and source regions of a plurality of ground selection transistors GST may be connected to the common source line CSL. The common source line CSL may be a region to which the source regions of the plurality of ground selection transistors GST are connected in common.

The string selection transistor SST may be connected to the string selection line SSL, and the ground selection transistor GST may be connected to the ground selection line GSL. The plurality of memory cell transistors MC1, MC2, . . . , MCn−1, and MCn may be respectively connected to the plurality of word lines WL (or WL1, WL2, . . . , WLn−1, and WLn).

Figure 4:
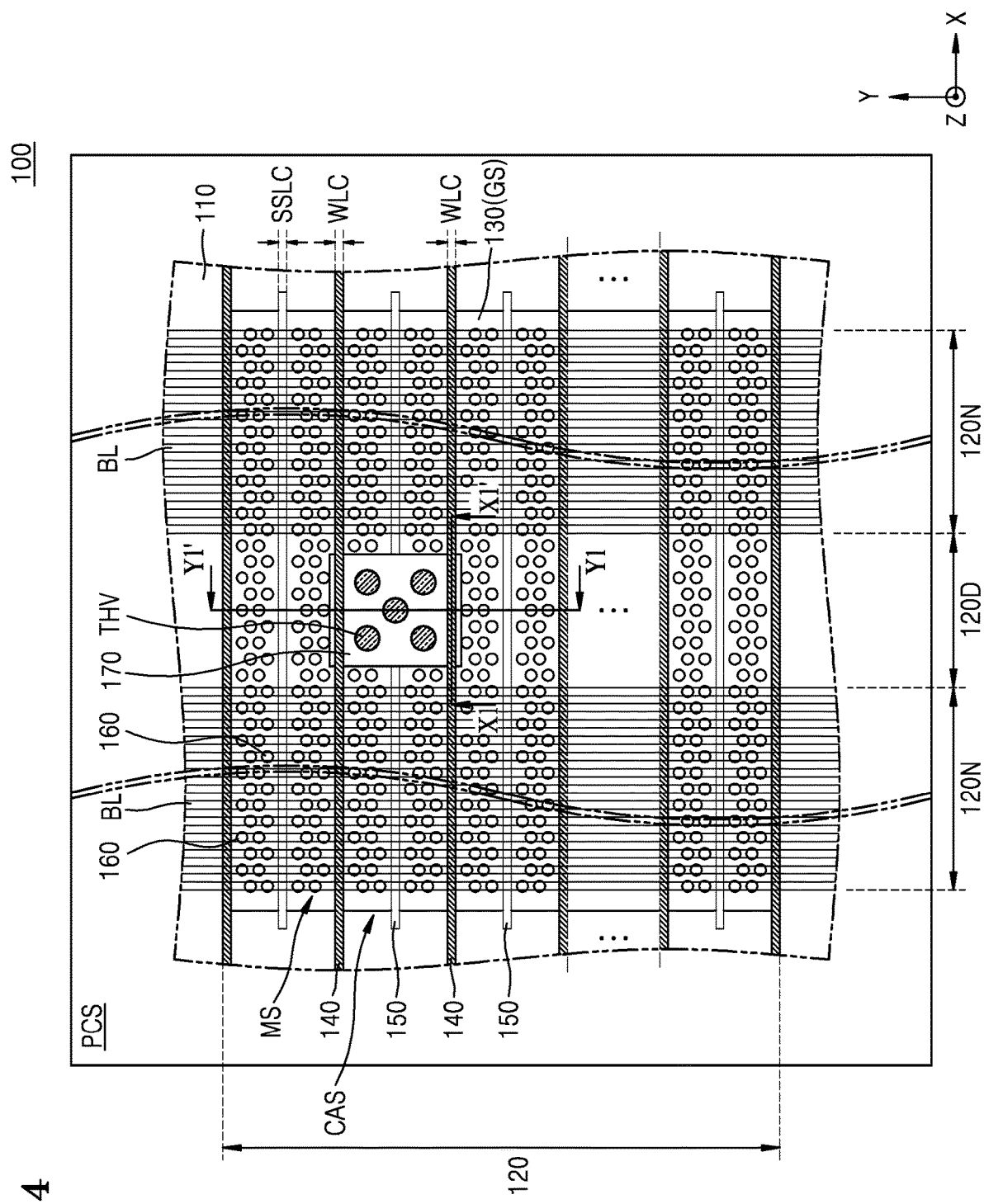
FIG. 4 is a schematic plan view of an IC device according to an embodiment.
Figure 5A:
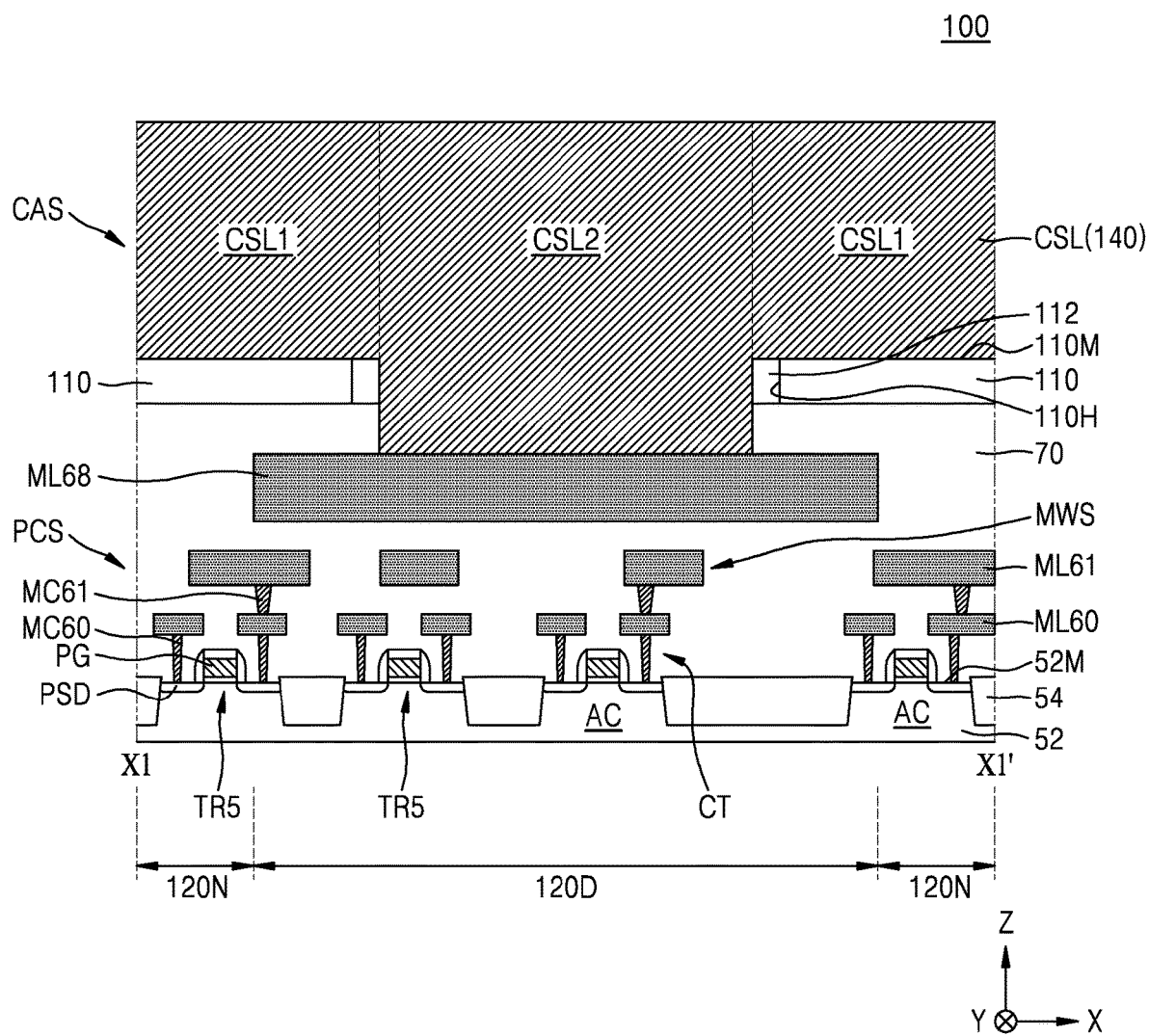
FIG. 5A is a cross-sectional view of some components taken along a line X1-X1' of FIG. 4.
Figure 5B:
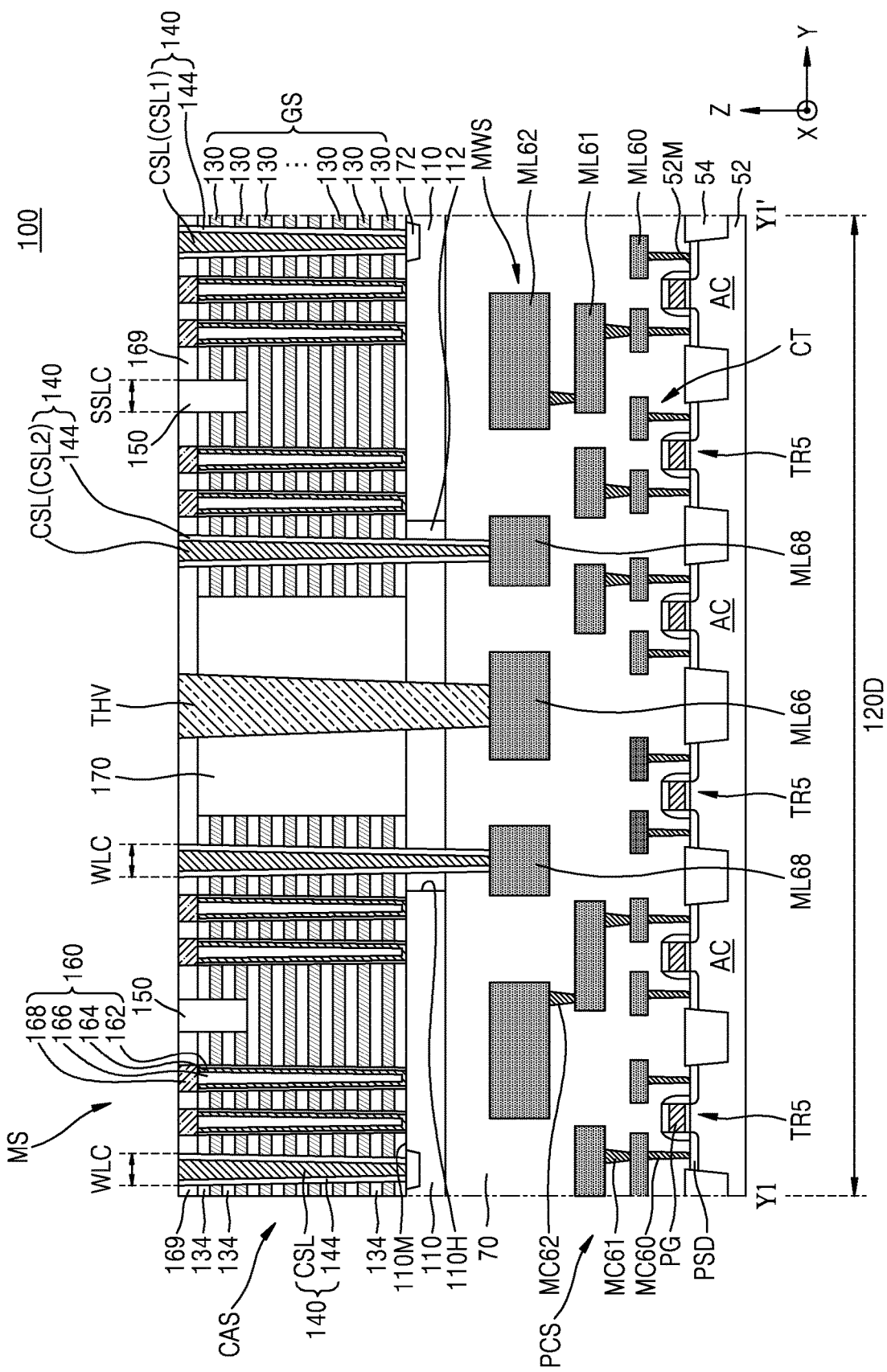
FIG. 5B is a cross-sectional view of some components taken along a line Y1-Y1' of FIG. 4.
Figure 5C:
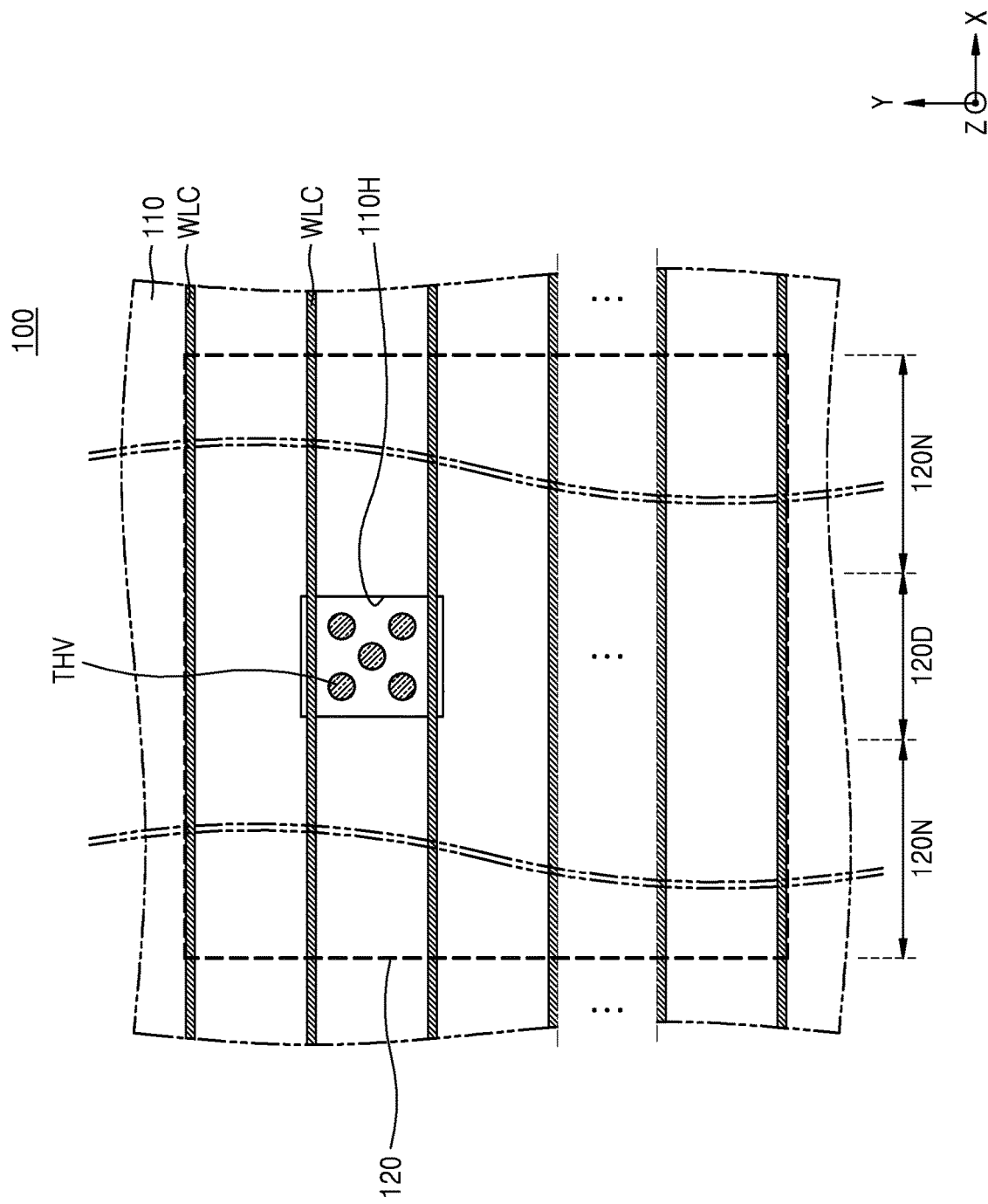
FIG. 5C is a plan view of some components of the IC device shown in FIG. 4.

FIG. 4 is a plan view of an IC device 100 according to an embodiment. FIG. 5A is a cross-sectional view of some components taken along a line X1-X1' of FIG. 4. FIG. 5B is a cross-sectional view of some components taken along a line Y1-Y1' of FIG. 4. FIG. 5C is a plan view of an upper substrate 110, a plurality of word line cut regions WLC, and a plurality of through electrodes THV of the IC device 100 shown in FIG. 4.

Referring to FIGS. 4 and 5A to 5C, the IC device 100 may constitute a portion of the IC device 10 described with reference to FIGS. 1 and 2. The IC device 100 may include a peripheral circuit structure PCS and a cell array structure CAS, which is arranged on the peripheral circuit structure PCS and overlaps the peripheral circuit structure PCS in a vertical direction (Z direction). The cell array structure CAS may include an upper substrate 110 formed on the peripheral circuit structure PCS and a memory stack MS located on the upper substrate 110. In example embodiments, the upper substrate 110 may include a semiconductor film. For example, the upper substrate 110 may include a polysilicon film.

The memory stack MS may include a memory cell region (refer to 120 in FIGS. 4 and 5C). The memory cell region 120 may include a plurality of memory cell blocks BLK1, BLK2, . . . , and BLKn described with reference to FIG. 2. The memory stack MS may include a plurality of gate stacks GS. Each of the plurality of gate stacks GS may include a plurality of gate lines 130, which extend parallel to each other in a lateral direction in the memory cell region 120 and overlap each other in the vertical direction (Z direction). Each of the plurality of gate lines 130 may include a metal, a metal silicide, a doped semiconductor, or a combination thereof. For example, each of the plurality of gate lines 130 may include a metal such as tungsten, nickel, cobalt, and tantalum; a metal silicide such as tungsten silicide, nickel silicide, cobalt silicide, and tantalum silicide; doped polysilicon; or a combination thereof.

An insulating film 134 may be between the upper substrate 110 and the plurality of gate lines 130 and between adjacent gate lines 130 of the plurality of gate lines 130. A top surface of an uppermost gate line 130 of the plurality of gate lines 130 may also be covered with the insulating film 134. The insulating film 134 may include, for example, silicon oxide.

As shown in FIG. 5B, a plurality of common source regions 172 may be formed in the upper substrate 110. The plurality of common source regions 172 may extend lengthwise in a first lateral direction (X direction). In example embodiments, the plurality of common source regions 172 may be impurity regions heavily doped with n-type impurities. The plurality of common source regions 172 may function as source regions configured to supply current to vertical memory cells. An item, layer, or portion of an item or layer described as extending "lengthwise" in a particular direction has a length in the particular direction and a width perpendicular to that direction, where the length is greater than the width.

The plurality of word line cut regions WLC, also described as word line separation regions, may intersect with the memory stack MS on the upper substrate 110 and extend in the first lateral direction (X direction). A width of the plurality of gate stacks GS in a second lateral direction (Y direction) may be defined by the plurality of word line cut regions WLC. The plurality of gate lines 130 may be spaced apart from each other (e.g., in the Y direction) by the plurality of word line cut regions WLC and may be arranged at regular intervals.

Each of the plurality of word line cut regions WLC may be filled with a common source line structure 140. The common source line structure 140 may include a common source line CSL and insulating spacers 144 covering sidewalls of the common source line CSL in the word line cut region WLC. Each of a plurality of common source lines CSL may include a metal such as tungsten, copper, or aluminum; a conductive metal nitride such as titanium nitride and tantalum nitride; a transitional metal such as titanium and tantalum; or a combination thereof. The insulating spacers 144 may include silicon oxide, silicon nitride, silicon oxynitride, or a low-k dielectric material. For example, the insulating spacers 144 may include a silicon oxide film, a silicon nitride film, silicon oxynitride (SiON), silicon oxycarbonitride (SiOCN), silicon carbonitride (SiCN), or a combination thereof.

The plurality of gate lines 130 included in one gate stack GS may be stacked on the upper substrate 110 to overlap each other in the vertical direction (Z direction) between two adjacent word line cut regions WLC. The plurality of gate lines 130 included in one gate stack GS may constitute the ground selection line GSL, the plurality of word lines WL, and the string selection line SSL, which are described with reference to FIG. 3. From among the plurality of gate lines 130 included in one gate stack GS, each of two uppermost gate lines 130 may be separated into two portions in the second lateral direction (Y direction) with a string selection line cut region SSLC therebetween. In the gate stack GS, the two portions of each of the two uppermost gate lines 130, which are separated from each other with the string selection line cut region SSLC therebetween, may each constitute the string selection lines SSL described with reference to FIG. 3. Although FIGS. 4 and 5B illustrate an example in which one string selection line cut region SSLC is formed in one gate stack GS, the inventive concept is not limited thereto. For example, at least two string selection line cut regions SSLC may be formed in one gate stack GS. The string selection line cut region SSLC may be filled with an insulating film 150. The insulating film 150 may include an oxide film, a nitride film, or a combination thereof. In example embodiments, at least a portion of the string selection line cut region SSLC may be filled with an air gap.

A plurality of channel structures 160 may pass through the plurality of gate lines 130 and extend in the vertical direction (Z direction) in the memory cell region 120 on the upper substrate 110. The plurality of channel structures 160 may be arranged a predetermined distance apart from each other in the first lateral direction (X direction) and the second lateral direction (Y direction).

Each of the plurality of channel structures 160 may include a gate dielectric film 162, a channel region 164, a buried insulating film 166, and a drain region 168. The gate dielectric film 162 may have a structure in which a tunneling dielectric film, a charge storage film, and a blocking dielectric film are sequentially formed on the channel region 164. The channel region 164 may include doped polysilicon or undoped polysilicon. The channel region 164 may have a cylindrical shape. An inner space of the channel region 164 may be filled with the buried insulating film 166. The buried insulating film 166 may include an insulating material. For example, the buried insulating film 166 may include silicon oxide, silicon nitride, silicon oxynitride, or a combination thereof. In some embodiments, the buried insulating film 166 may be omitted.

In this case, the channel region 164 may have a pillar structure having no inner space. The drain region 168 may include a doped polysilicon film. The plurality of drain regions 168 may be insulated from each other by an upper insulating film 169. The upper insulating film 169 may include an oxide film, a nitride film, or a combination thereof.

As shown in FIG. 4, in the cell array structure CAS, the memory cell region 120 may include a plurality of normal cell regions 120N and a dummy cell region 120D. An example in which the memory cell region 120 includes two normal cell regions 120N and one dummy cell region 120D is illustrated in FIG. 4. The dummy cell region 120D may extend in the second lateral direction (Y direction) between the two normal cell regions 120N. The two normal cell regions 120N may be spaced apart from each other with the dummy cell region 120D therebetween. However, the numbers and arrangements of the normal cell regions 120N and the dummy cell regions 120D are not limited to examples shown in FIG. 4 and may be variously modified and changed within the scope of the inventive concept.

In the normal cell region 120N, a plurality of bit lines BL are arranged on the plurality of channel structures 160. The plurality of bit lines BL may be arranged parallel to each other and extend lengthwise in the second lateral direction (Y direction). In the normal cell region 120N, each of the plurality of channel structures 160 may be connected to a corresponding one of the plurality of bit lines BL through a contact pad (not shown). From among the plurality of channel structures 160, a plurality of channel structures 160 arranged between the string selection line cut region SSLC and the word line cut region WLC in the normal cell region 120N may be normal channel structures. From among the plurality of channel structures 160, a channel structure (not shown) overlapping the string selection line cut region SSLC and a channel structure 160 arranged in the dummy cell region 120D may be a dummy channel structure. Dummy channel structures, as discussed herein, may have a similar or the same physical structure as normal channel structures, but they do not function as channels. For example, as discussed above and as shown in FIG. 4, in some embodiments, dummy channel structures are not connected to any bit lines, so bit line voltages cannot be applied to these structures, and these structures cannot be used to store data in the same way as normal channel structures.

As shown in FIGS. 5A to 5C, the upper substrate 110 may include a through hole 110H. The through hole 110H of the upper substrate 110 may be located below the memory cell region 120. The through hole 110H may be positioned below the dummy cell region 120D from among the memory cell regions 120. The through hole 110H may be filled with a buried insulating film 112. In example embodiments, the buried insulating film 112 may include a silicon oxide film.

In the dummy cell region 120D, an insulating structure 170 may be arranged on the upper substrate 110. The insulating structure 170 may pass through the plurality of gate lines 130 included in the gate stack GS and a plurality of insulating films 134 and extend in the vertical direction (Z direction). In example embodiments, the insulating structure 170 may include a silicon oxide film.

At least one of the plurality of word line cut regions WLC may intersect with the memory stack MS and the through hole 110H and extend lengthwise in the first lateral direction (X direction). The at least one word line cut region WLC may include a portion, which extends lengthwise in the first lateral direction (X direction) on a main surface 110M of the upper substrate 110, and a portion, which penetrates the upper substrate 110 through the through hole 110H formed in the upper substrate 110 in the vertical direction (Z direction).

As shown in FIGS. 5A and 5B, at least one of a plurality of common source lines CSL filling the plurality of word line cut regions WLC may include a first portion CSL1 and a second portion CSL2. The first portion CSL1 may extend lengthwise in the first lateral direction (X direction) on the main surface 110M of the upper substrate 110. The second portion CSL2 may be integrally connected to the first portion CSL1, for example to form a continuous material. The second portion CSL2 may penetrate the upper substrate 110 from an upper portion of the upper substrate 110 through the through hole 110H in the vertical direction (Z direction) and extend into the peripheral circuit structure PCS. In the common source line CSL, a length of the second portion CSL2 in the vertical direction (Z direction) may be greater than a length of the first portion CSL1 in the vertical direction (Z direction).

The second portion CSL2 of the common source line CSL may not overlap the upper substrate 110 in the vertical direction (Z direction). The second portion CSL2 of the common source line CSL may pass through the upper insulating film 169, the insulating structure 170, and the buried insulating film 112 and extend into the peripheral circuit structure PCS in the vertical direction (Z direction).

FIGS. 4 and 5A to 5C exemplarily illustrate a configuration in which each of two word line cut regions WLC includes a portion extending across the through hole 110H formed in the upper substrate 110, and each of two common source lines CSL filling the two word line cut regions WLC includes the second portion CSL2 penetrating the upper substrate 110 through the through hole 110H of the upper substrate 110. However, the inventive concept is not limited thereto. In example embodiments, only one of a plurality of word line cut regions WLC may extend across the through hole 110H formed in the upper substrate 110, and only one common source line CSL filling the one word line cut region WLC may include a second portion CSL2 that penetrates the upper substrate 110 through the through hole 110H and extends into the peripheral circuit structure PCS. In other example embodiments, at least three of a plurality of word line cut regions WLC may extend across the through hole 110H formed in the upper substrate 110, and at least three common source lines CSL filling the at least three word line cut regions WLC may include a second portion CSL2, which penetrates the upper substrate 110 through the through hole 110H and extends into the peripheral circuit structure PCS. The second portion CSL2 of the common source line CSL may be spaced apart from the upper substrate 110 with the buried insulating film 112 therebetween in the lateral direction.

In the dummy cell region 120D, the plurality of through electrodes THV may pass through the gate stack GS of the cell array structure CAS, penetrate the upper substrate 110 through the through hole 110H, and extend lengthwise into the peripheral circuit structure PCS in the vertical direction (Z direction). Each of the plurality of through electrodes THV may be surrounded by the upper insulating film 169 and the insulating structure 170 in the cell array structure CAS and surrounded by the buried insulating film 112 inside the through hole 110H of the upper substrate 110.

Although FIG. 5C illustrates only one through hole 110H formed in the upper substrate 110, a plurality of through holes 110H may be formed in the upper substrate 110. Although FIGS. 4 and 5C illustrate an example in which five through electrodes THV pass through one insulating structure 170 and one through hole 110H, the number of through electrodes THV, which pass through one insulating structure 170 and one through hole 110H, is not limited to the example shown in FIGS. 4 and 5C, and the number and size of through electrodes THV may be variously changed within the scope of the inventive concept.

As the number of stages of the gate lines 130 stacked in the vertical direction (Z direction) in the memory stack MS formed on the upper substrate 110 increases, design rules for ensuring a minimum separation distance between the plurality of through electrodes THV penetrating the upper substrate 110 through the through hole 110H and the upper substrate 110 may be more rigorous. A stable separation distance greater than or equal to a minimum separation distance required by the design rules may be ensured between the plurality of through electrodes THV penetrating the upper substrate 110 through the through hole 110H and the upper substrate 110. In example embodiments, there may be a separation distance, which is selected in the range of about 0.01 µm to about 1.5 µm, between the plurality of through electrodes THV, which penetrate the upper substrate 110 through the through hole 110H, and the upper substrate 110.

According to certain embodiments, the second portion CSL2 of the common source line CSL, which intersects with the through hole 110H and penetrates the upper substrate 110 through the through hole 110H, does not overlap the upper substrate 110 in the vertical direction (Z direction).

As shown in FIGS. 5A and 5B, the peripheral circuit structure PCS may include a lower substrate 52, a plurality of circuits CT formed on a main surface 52M of the lower substrate 52, and a multilayered interconnection structure MWS. Each of the plurality of through electrodes THV may be connected to at least one of the plurality of circuits CT through the multilayered interconnection structure MWS included in the peripheral circuit structure PCS, and may be connected between those circuits and a circuit or wiring line above the cell array structure CAS of the integrated circuit device 10 (e.g., to a controller).

The lower substrate 52 may include a semiconductor substrate. For example, the lower substrate 52 may include silicon (Si), germanium (Ge), or silicon germanium (SiGe). An active region AC may be defined by a device isolation film 54 in the lower substrate 52. The plurality of circuits CT may include various circuits included in the peripheral circuit 30 described with reference to FIG. 1. In example embodiments, the plurality of circuits CT may include unit elements, such as resistors and capacitors. A plurality of transistors TR5 included in the plurality of circuits CT may be formed on the active region AC. Each of the plurality of transistors TR5 may include a gate PG and source/drain regions PSD formed in the active region AC on both sides of the gate PG.

The multilayered interconnection structure MWS may include a plurality of peripheral circuit interconnection layers (e.g., ML60, ML61, ML62, and ML66) connected to the plurality of circuits CT, a plurality of peripheral circuit contacts (e.g., MC60, MC61, and MC62), and a floating interconnection layer ML68, which is spaced apart from the peripheral circuit interconnection layers ML60, ML61, ML62, and ML66 and the peripheral circuit contacts MC60, MC61, and MC62. The floating interconnection layer ML68 may be formed at the same level as uppermost peripheral circuit interconnection layers ML62 and ML66, which are closest to the upper substrate 110 from among the peripheral circuit interconnection layers ML60, ML61, ML62, and ML66. Here, a term "level" refers to a distance from a top surface of the lower substrate 52 in a vertical direction (Z direction or −Z direction). The peripheral circuit interconnection layers ML60, ML61, ML62, and ML66 may be referred to as peripheral circuit conductive interconnection patterns, and the floating interconnection layer ML68 may be referred to as a floating conductive interconnection pattern. The peripheral circuit conductive interconnection patterns and the floating conductive interconnection pattern may be formed at the same vertical layer of the multilayered interconnection structure MWS.

Some of the peripheral circuit interconnection layers ML60, ML61, ML62, and ML66 may be capable of being electrically connected to the plurality of transistors TR5. The peripheral circuit contacts MC60, MC61, and MC62 may connect some peripheral circuit interconnection layers (e.g., ML60, ML61, ML62, and ML66), which are selected out of the peripheral circuit interconnection layers ML60, ML61, ML62, and ML66. A lower end of each of the through electrodes THV may be connected to some peripheral circuit interconnection layers (e.g., ML66) of the uppermost peripheral circuit interconnection layers ML62 and ML66, which are closest to the upper substrate 110 from among the peripheral circuit interconnection layers ML60, ML61, ML62, and ML66. The second portion CSL2 of the common source line CSL, which penetrates the upper substrate 110 through the through hole 110H and extends into the peripheral circuit structure PCS, may be connected to the floating interconnection layer ML68. The floating interconnection layer ML68 may not be connected to a conductive material other than one common source line CSL that is in contact with a top surface of the floating interconnection layer ML68. The floating interconnection layer ML68 may be part of the peripheral circuit structure PCS, but may not contact any other conductive components of peripheral circuit structure PCS. The floating interconnection layer ML68 may be electrically isolated from circuitry disposed in peripheral circuit structure PCS. During an operation of the IC device 100, the floating interconnection layer ML68 may have the same electrical bias as one common source line CSL that is in contact with the top surface of the floating interconnection layer ML68.

Each of the plurality of peripheral circuit interconnection layers ML60, ML61, ML62, and ML66, the plurality of peripheral circuit contacts MC60, MC61, and MC62, and the floating interconnection layer ML68 may include conductive material such as a metal, a conductive metal nitride, a metal silicide, or a combination thereof. For example, each of the plurality of peripheral circuit interconnection layers ML60, ML61, ML62, and ML66, the plurality of peripheral circuit contacts MC60, MC61, and MC62, and the floating interconnection layer ML68 may include a conductive material, such as tungsten, molybdenum, titanium, cobalt, tantalum, nickel, tungsten silicide, titanium silicide, cobalt silicide, tantalum silicide, nickel silicide, or the like. Although FIGS. 5A and 5B illustrate an example in which the multilayered interconnection structure MWS includes three interconnection layers in the vertical direction (Z direction), the inventive concept is not limited to the example shown in FIGS. 5A and 5B. For example, the multilayered interconnection structure MWS may include two, four, or more interconnection layers.

The plurality of circuits CT, the peripheral circuit interconnection layers ML60, ML61, ML62, and ML66, the peripheral circuit contacts MC60, MC61, and MC62, and the floating interconnection layer ML68 may be covered by an interlayer insulating film 70. The plurality of through electrodes THV may pass through a portion of the interlayer insulating film 70 and contact a top surface of the peripheral circuit interconnection layer ML66. The term "contact" or "in contact with," as used herein, refers to a direct connection (e.g., touching). The second portion CSL2 of the common source line CSL, which penetrates the upper substrate 110 through the through hole 110H and extends into the peripheral circuit structure PCS, may pass through a portion of the interlayer insulating film 70 and contact the top surface of the floating interconnection layer ML68. The interlayer insulating film 70 may include silicon oxide, SiON, SiOCN, or the like.

Figure 6:
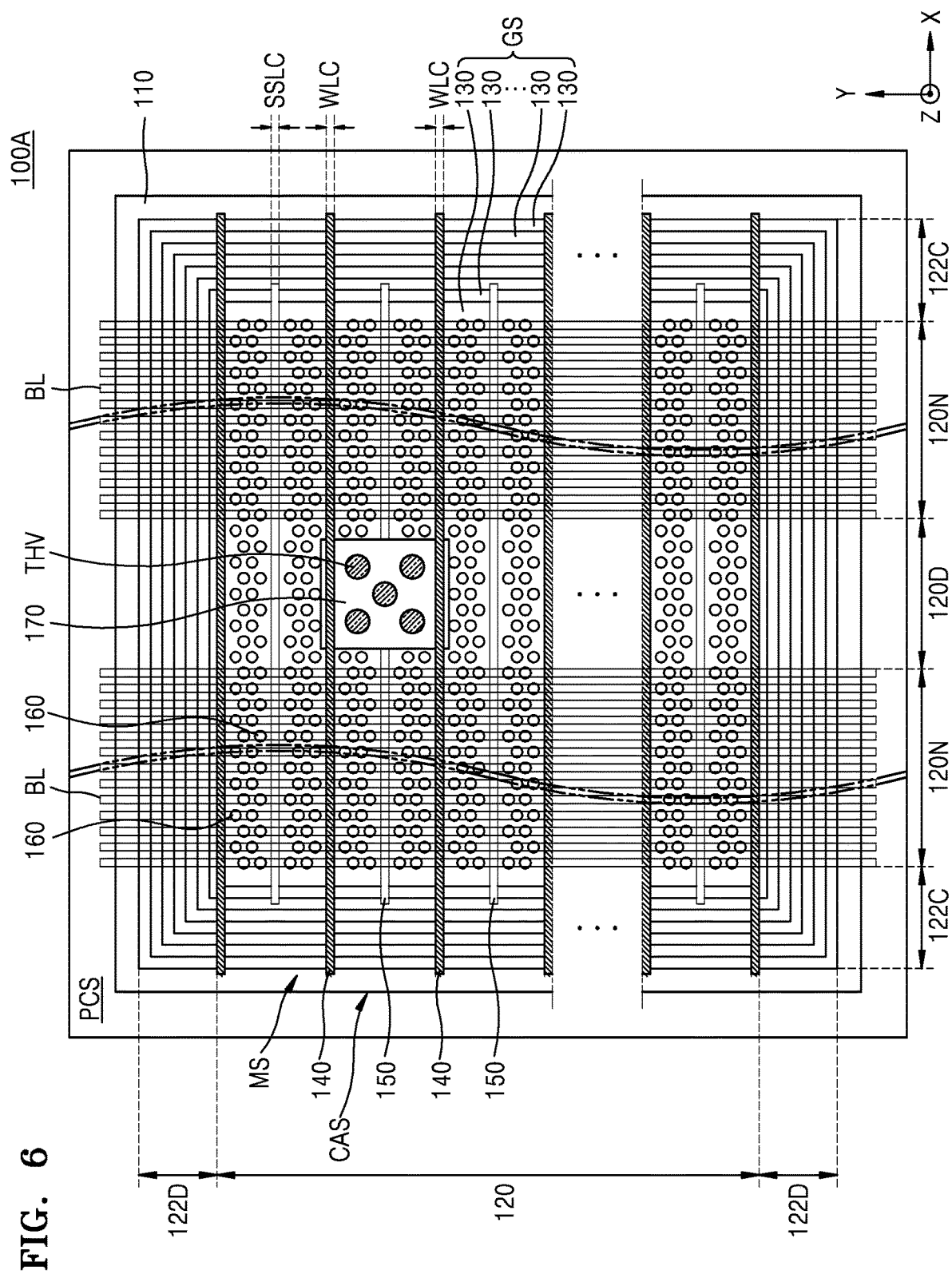
FIG. 6 is a schematic plan view of an IC device according to an embodiment.
Figure 7:
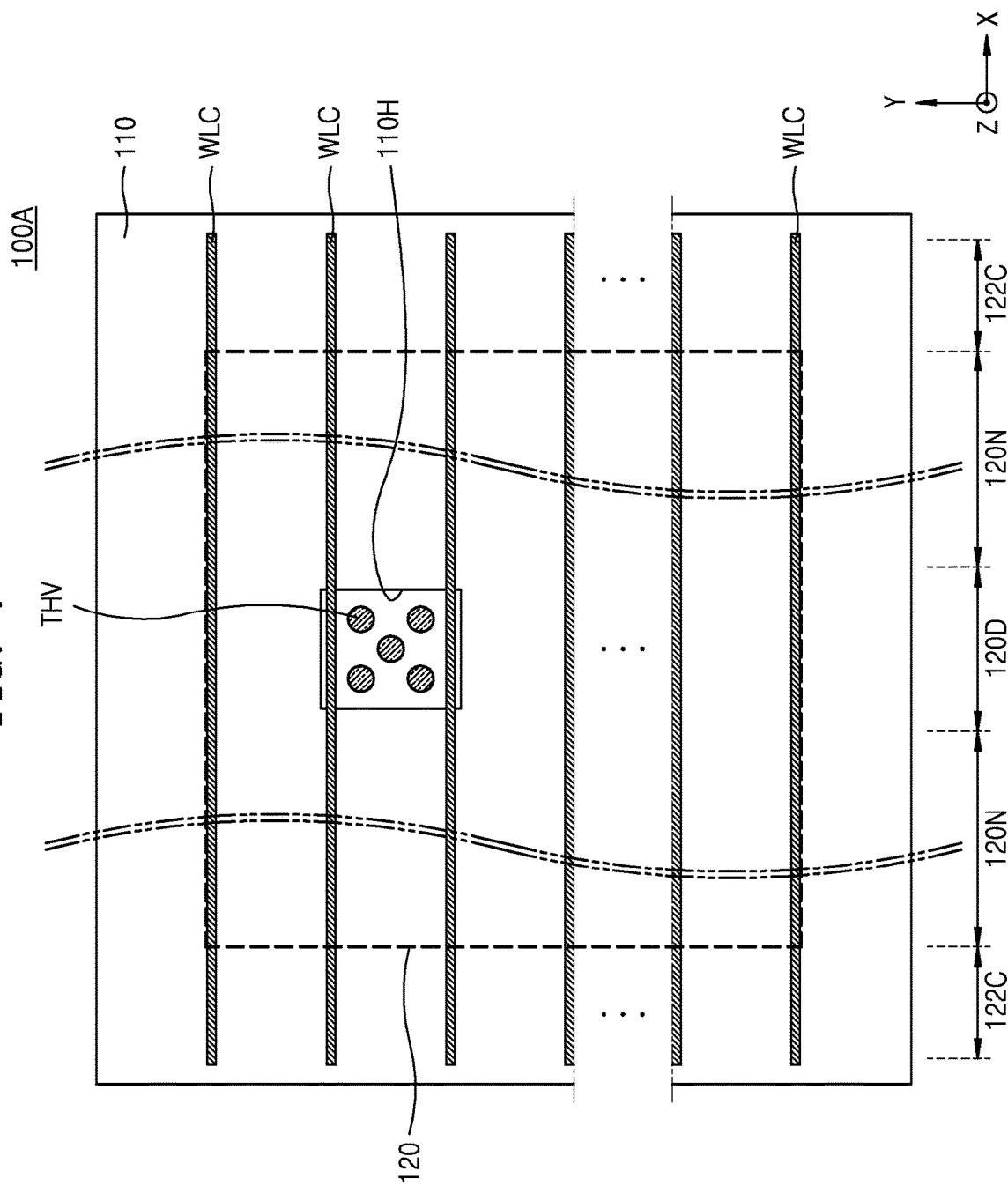
FIG. 7 is a plan view of some components of the IC device shown in FIG. 6.

FIG. 6 is a plan view of an IC device 100A according to an embodiment. FIG. 7 is a plan view of an upper substrate 110, a plurality of word line cut regions WLC, and a plurality of through electrodes THV of the IC device 100A shown in FIG. 6.

Referring to FIGS. 6 and 7, the IC device 100A may have substantially the same configuration as the IC device 100 described with reference to FIGS. 4 and 5A to 5C. However, the IC device 100A may include a pair of connection stepped regions 122C, which are respectively located on opposite sides of a memory cell region 120 in a first lateral direction (X direction), and a pair of dummy stepped regions 122D, which are respectively located on opposite sides of the memory cell region 120 in a second lateral direction (Y direction). In the pair of connection stepped regions 122C and the pair of dummy stepped regions 122D, widths of a plurality of gate lines 130 in the first lateral direction (X direction) and the second lateral direction (Y direction) may be gradually reduced in a direction away from the upper substrate 110. Each of the plurality of gate stacks GS may include the plurality of gate lines 130, which extend parallel in a lateral direction over the memory cell region 120 and the connection stepped regions 122C and overlap each other in a vertical direction (Z direction).

Figure 8:
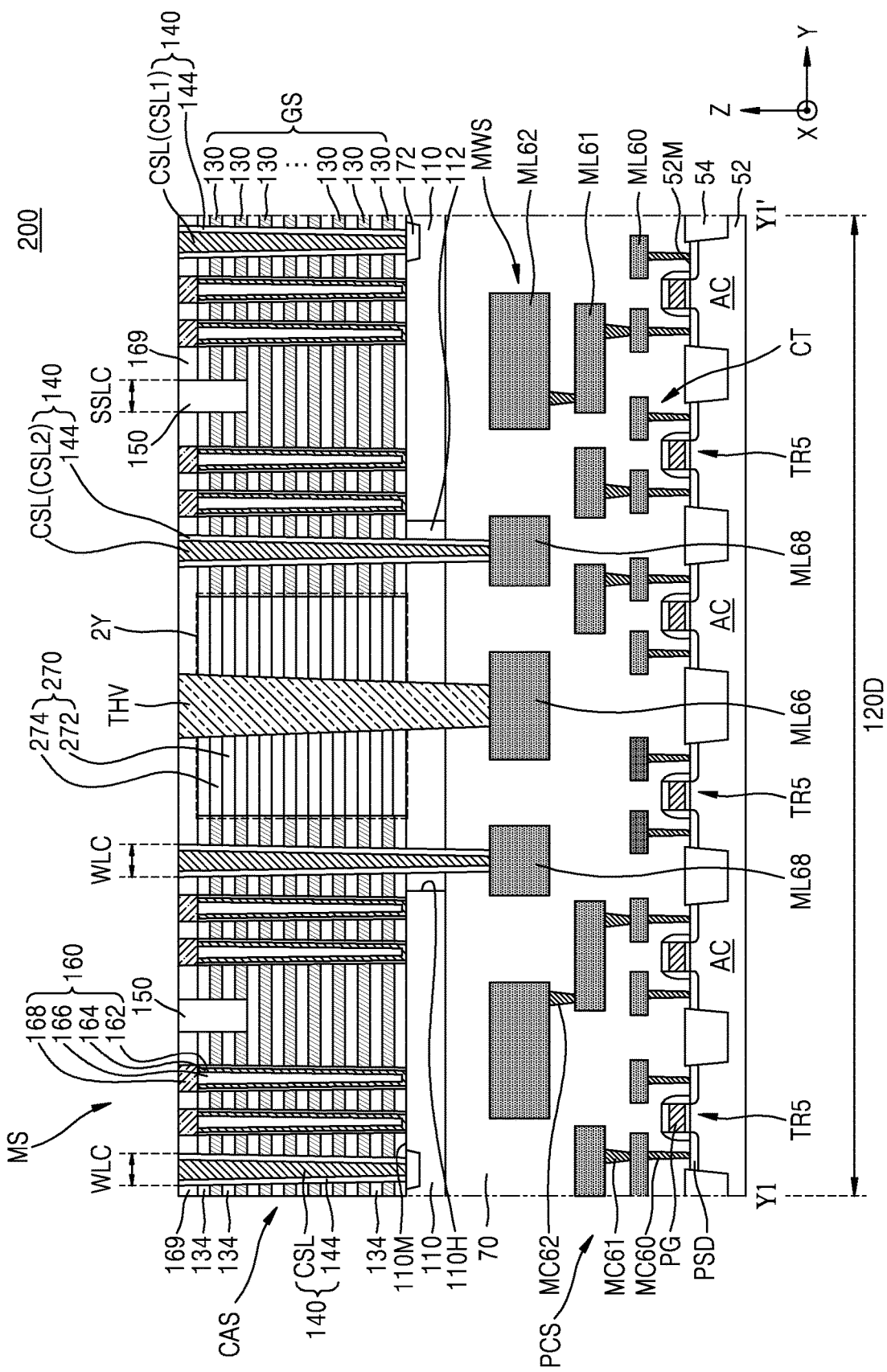
FIG. 8 is a cross-sectional view of an IC device according to an embodiment.

FIG. 8 is a cross-sectional view of an IC device 200 according to an embodiment. A sectional configuration of some components of a region corresponding to a cross-section taken along line Y1-Y1' of FIG. 4 is illustrated in FIG. 8.

Referring to FIG. 8, the IC device 200 may have substantially the same configuration as the IC device 100 described with reference to FIGS. 4 and 5A to 5C. However, the IC device 200 may include an insulating structure 270 instead of the insulating structure 170. The insulating structure 270 may overlap a buried insulating film 112 filling a through hole 110H of an upper substrate 110 in a vertical direction (Z direction). The insulating structure 270 may correspond to a dashed line region 2Y in FIG. 8. The insulating structure 270 may have a multilayered structure including a plurality of first insulating films 272 and a plurality of second insulating films 274, which are alternately stacked one by one on the buried insulating film 112. The plurality of first insulating films 272 may include the same material as a material included in an insulating film 134. The plurality of second insulating films 274 may include a material different from the material included in the insulating film 134. For example, the plurality of first insulating films 272 may include a silicon oxide film, and the plurality of second insulating films 274 may include a silicon nitride film. A top surface of the insulating structure 270 may be covered by an upper insulating film 169.

Figure 9:
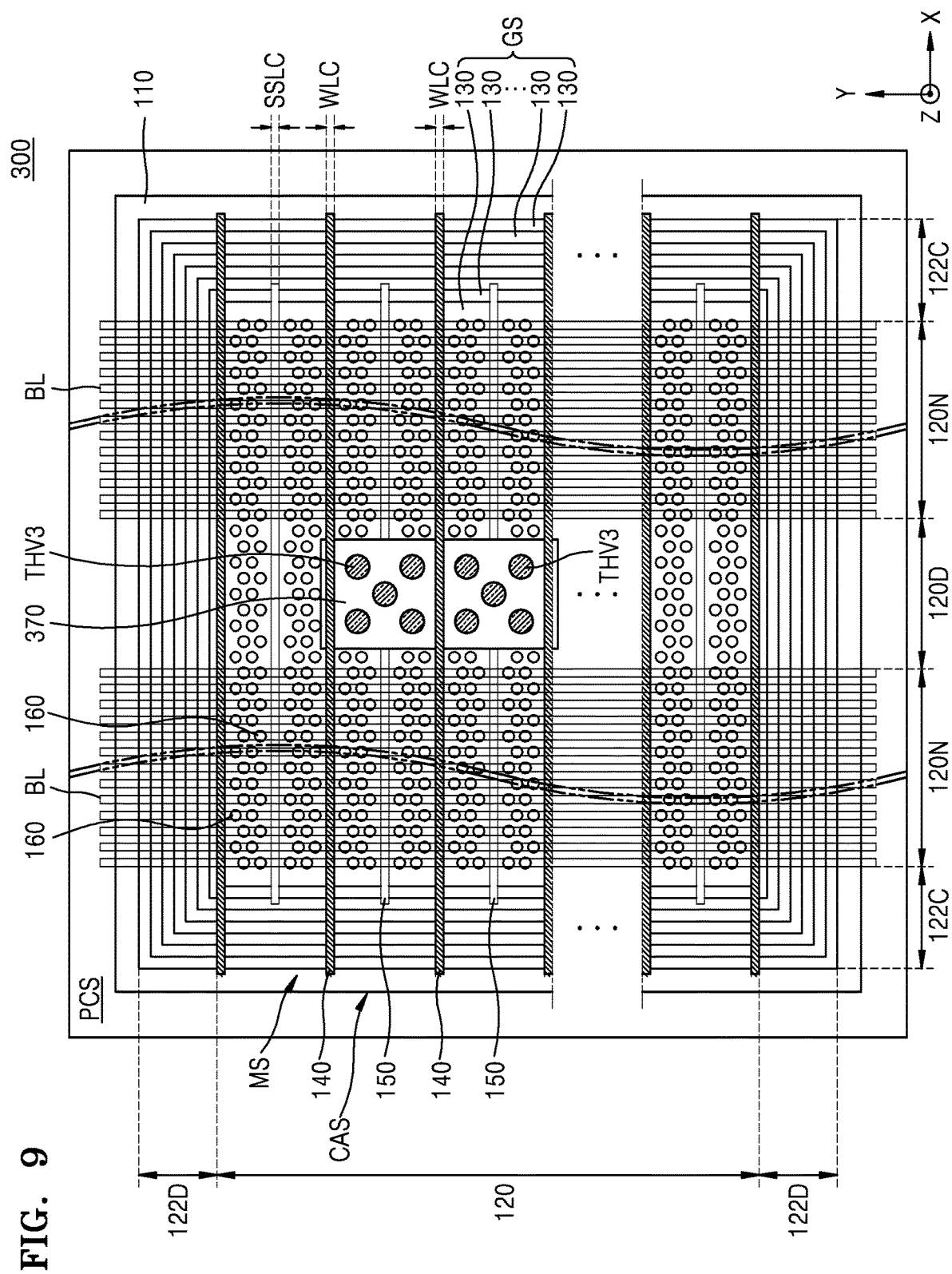
FIG. 9 is a plan view of an IC device according to an embodiment.
Figure 10:
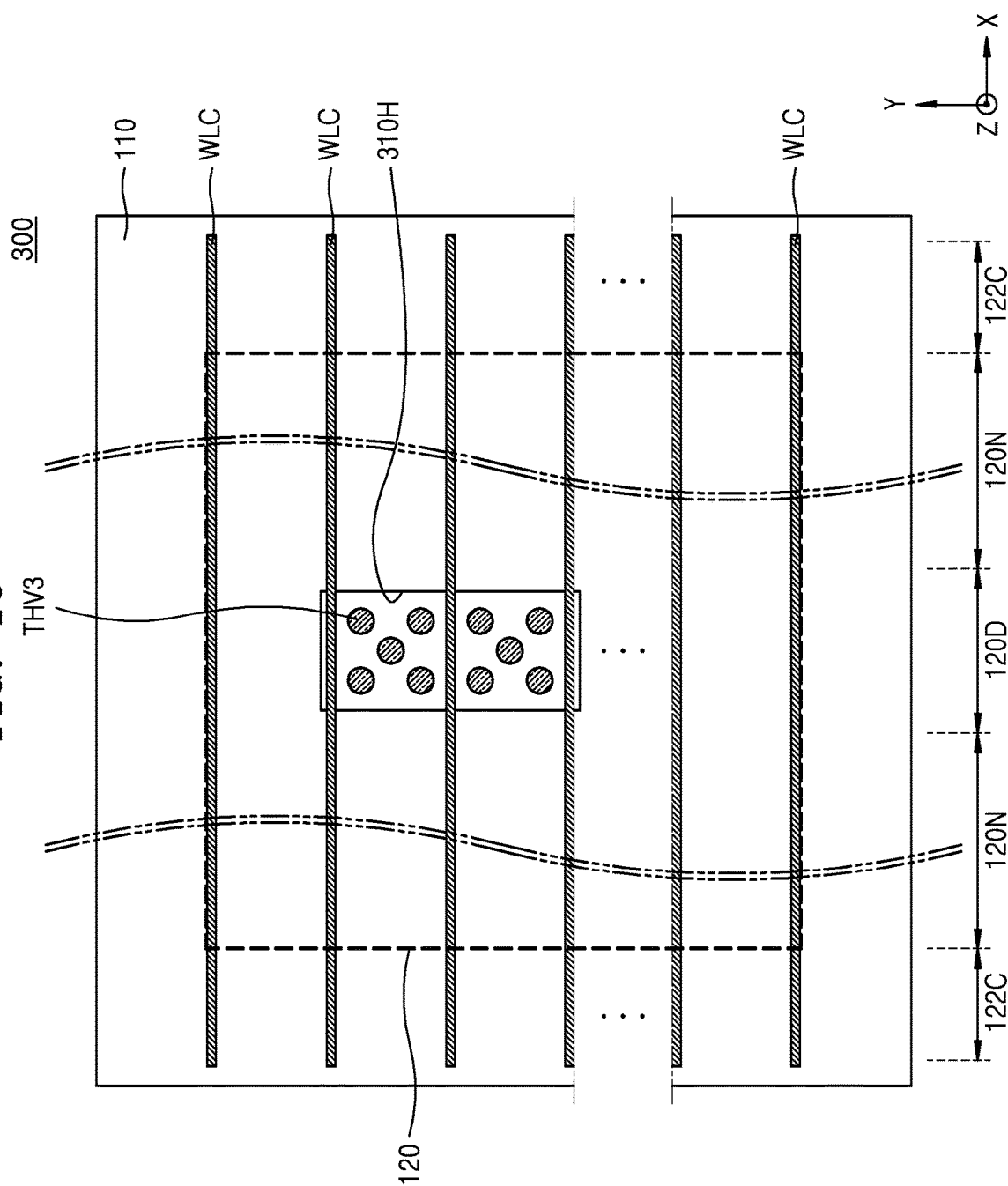
FIG. 10 is a plan view of some components of the IC device shown in FIG. 9.

FIG. 9 is a plan view of an IC device 300 according to an embodiment. FIG. 10 is a plan view of an upper substrate 110, a plurality of word line cut regions WLC, and a plurality of through electrodes THV3 of the IC device 300 shown in FIG. 9.

Referring to FIGS. 9 and 10, the IC device 300 may have substantially the same configuration as the IC device 100A described with reference to FIGS. 6 and 7. However, a through hole 310H may be formed in the upper substrate 110 at a position with a dummy cell region 120D of a memory cell region 120 of the IC device 300. The through hole 310H may intersect with at least two gate stacks GS and extend in a second lateral direction (Y direction).

An insulating structure 370 may be located on the upper substrate 110 at a position overlapping the through hole 310H in a vertical direction (Z direction). The insulating structure 370 may have the same configuration as the insulating structure 170 described with reference to FIGS. 4 and 5B or the insulating structure 270 described with reference to FIG. 8.

Three of a plurality of word line cut regions WLC may intersect with the through hole 310H formed in the upper substrate 110 and extend in a first lateral direction (X direction).

The IC device 300 may include a plurality of through electrodes THV3, which extend in the vertical direction (Z direction) through the through hole 310H. Similarly to the through electrode THV shown in FIG. 5B, each of the plurality of through electrodes THV3 may pass through a plurality of gate lines 130 in the dummy cell region 120D, penetrate the upper substrate 110 through the through hole 310H, and extend lengthwise into a peripheral circuit structure PCS in the vertical direction (Z direction). The upper substrate 110 may not be interposed between the respective through electrodes THV3. Some of the plurality of through electrodes THV3 may be spaced apart from each other with one word line cut region WLC therebetween.

Each of the plurality of through electrodes THV3 may be surrounded by the insulating structure 370 in a cell array structure CAS. Similarly to the through electrode THV shown in FIG. 5B, the plurality of through electrodes THV3 may be connected to at least one of a plurality of circuits CT through a peripheral circuit interconnection layer ML66 in the peripheral circuit structure PCS.

The plurality of through electrodes THV3 may include two through electrodes THV3, which are spaced apart from each other with one word line cut region WLC intersecting with the through hole 310H therebetween. Some of the plurality of through electrodes THV3 that pass through the through hole 310H may be spaced apart from other through electrodes THV3 with a second portion (refer to CSL2 in FIG. 5A) of one common source line CSL intersecting with the through hole 310H therebetween. Since the second portion CSL2 of the common source line CSL does not overlap the upper substrate 110 in the vertical direction (Z direction), it may be easy to ensure a stable separation distance greater than or equal to a minimum separation distance required by the design rules between the upper substrate 110 and the plurality of through electrodes THV3. Accordingly, a degree of freedom for layout design of the plurality of through electrodes THV3 that pass through one through hole 310H may be improved.

Although FIG. 10 illustrates an example in which one through hole 310H is formed in the upper substrate 110, a plurality of through holes 310H may be formed in the upper substrate 110. The number of through electrodes THV3 that pass through the one through hole 310H is not limited to the example shown in FIGS. 9 and 10 and may be variously changed within the scope of the inventive concept.

Figure 11:
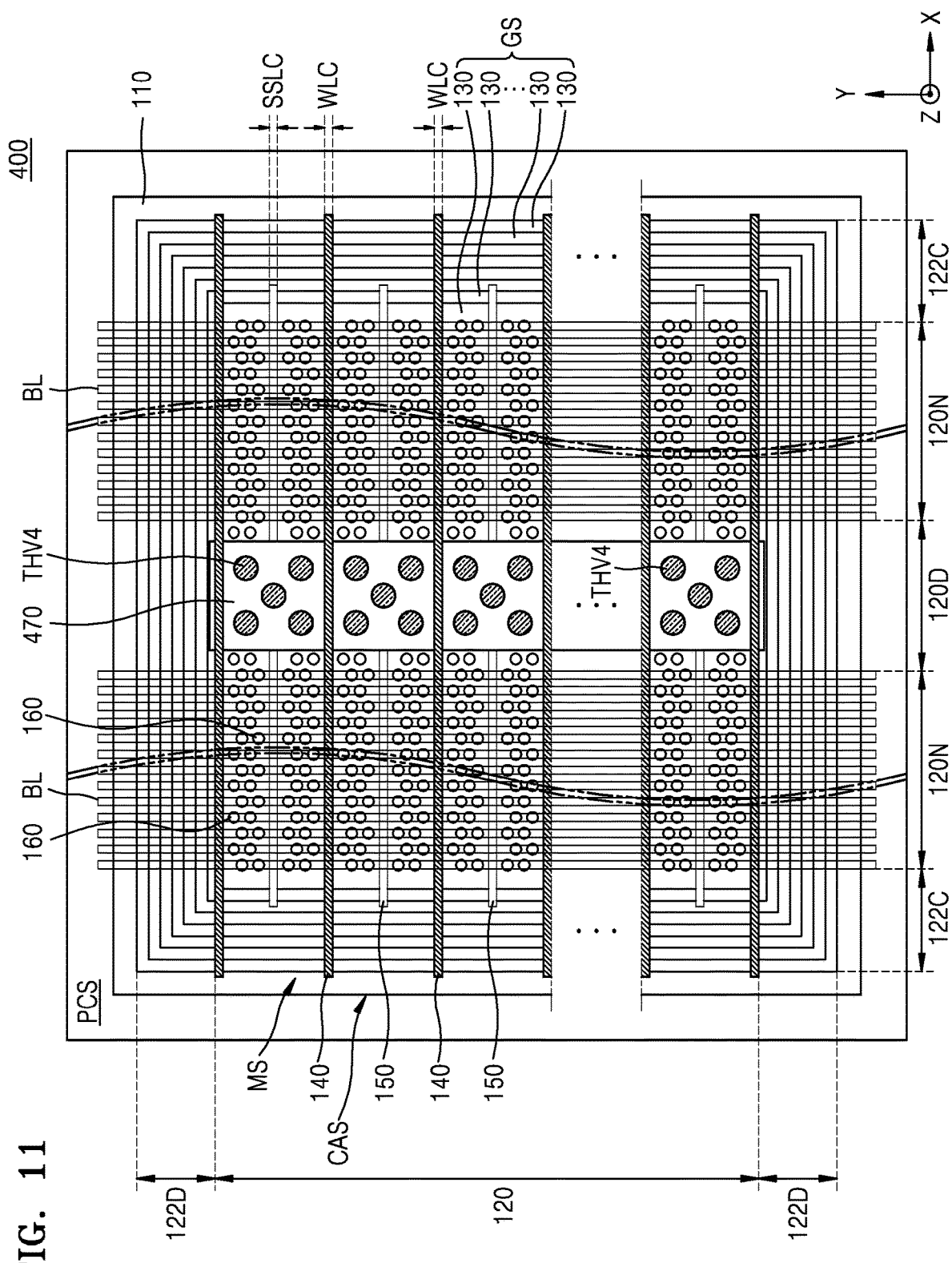
FIG. 11 is a plan view of an IC device according to an embodiment.
Figure 12:
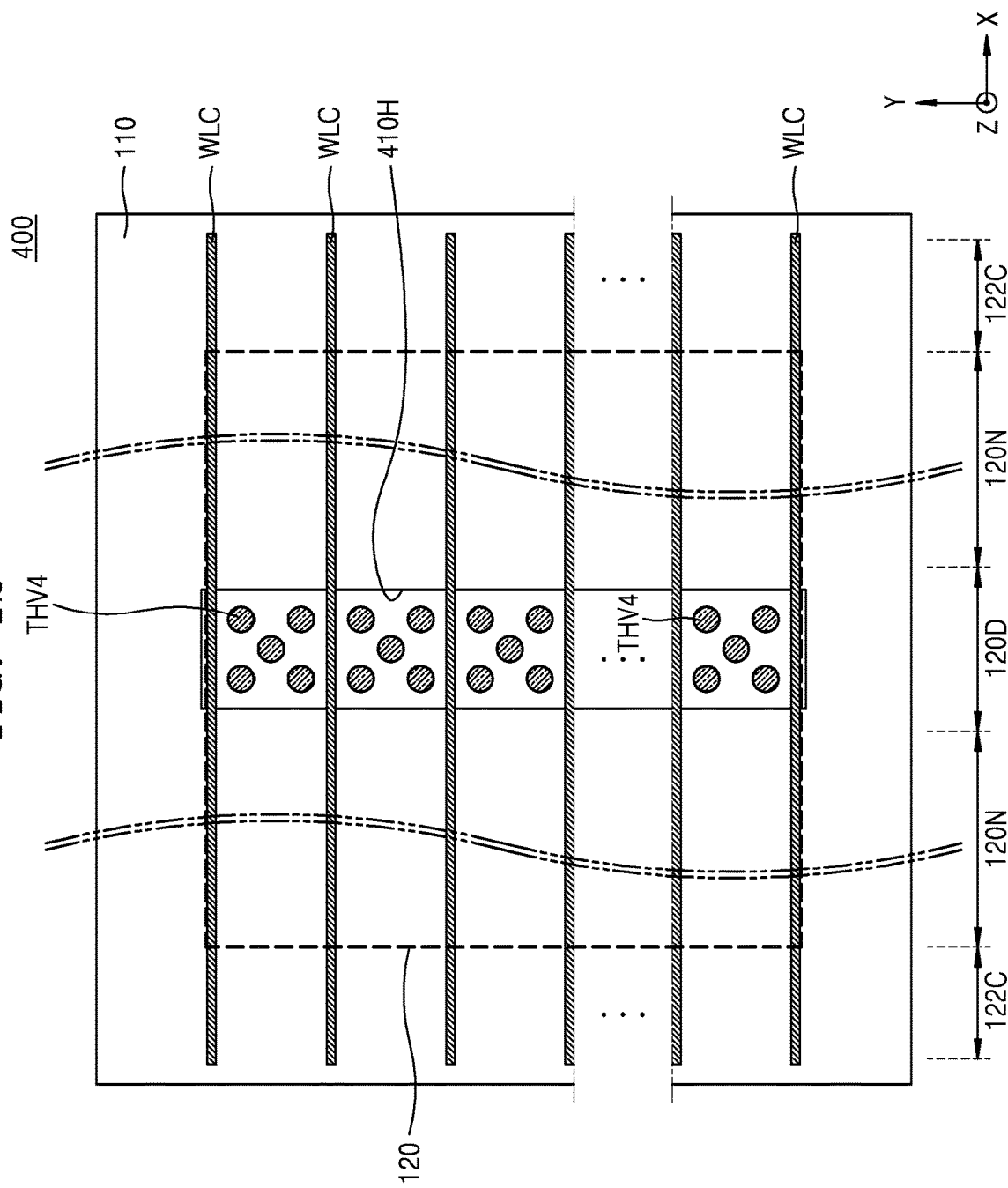
FIG. 12 is a plan view of some components of the IC device shown in FIG. 11.

FIG. 11 is a plan view of an IC device 400 according to an embodiment. FIG. 12 is a plan view of the upper substrate 110, the plurality of word line cut regions WLC, and a plurality of through electrodes THV4 of the IC device 400 shown in FIG. 11.

Referring to FIGS. 11 and 12, the IC device 400 may have substantially the same configuration as the IC device 100A described with reference to FIGS. 6 and 7. However, a through hole 410H may be formed in the upper substrate 110 in a dummy cell region 120D of a memory cell region 120 of the IC device 400. The through hole 410H may cross over the memory cell region 120 and extend lengthwise in a second lateral direction (Y direction). The memory cell region 120 may include two normal cell regions 120N, which are separated from each other by the through hole 410H.

An insulating structure 470 may be arranged on the upper substrate 110 at a position overlapping the through hole 410H in a vertical direction (Z direction). The insulating structure 470 may have the same configuration as the insulating structure 170 described with reference to FIGS. 4 and 5B or the insulating structure 270 described with reference to FIG. 8.

The plurality of word line cut regions WLC located on the upper substrate 110 may all intersect with the through hole 410H formed in the upper substrate 110 and extend in a first lateral direction (X direction).

The IC device 400 may include the plurality of through electrodes THV4, which extend in the vertical direction (Z direction) through the through hole 410H. Similarly to the through electrode THV shown in FIG. 5B, each of the plurality of through electrodes THV4 may pass through a plurality of gate lines 130 in the dummy cell region 120D, penetrate the upper substrate 110 through the through hole 410H, and extend lengthwise into a peripheral circuit structure PCS in the vertical direction (Z direction). The upper substrate 110 may not be interposed between each of the plurality of through electrodes THV4.

Each of the plurality of through electrodes THV4 may be surrounded by the insulating structure 470 in a cell array structure CAS. Similarly to the through electrode THV shown in FIG. 5B, the plurality of through electrodes THV4 may be connected to at least one of a plurality of circuits through a peripheral circuit interconnection layer ML66 included in the peripheral circuit structure PCS.

The plurality of through electrodes THV4 may include two through electrodes THV4, which are spaced apart from each other with one word line cut region WLC intersecting with the through hole 410H therebetween. Some of the plurality of through electrodes THV4 that pass through the through hole 410H may be spaced apart from other through electrodes THV4 with a second portion (refer to CSL2 in FIG. 5A) of one common source line CSL intersecting with the through hole 410H therebetween. Since the second portion CSL2 of the common source line CSL does not overlap the upper substrate 110 in the vertical direction (Z direction), it may be easy to ensure a stable separation distance greater than or equal to a minimum separation distance required by the design rules between the upper substrate 110 and the plurality of through electrodes THV4. Accordingly, a degree of freedom for layout design of the plurality of through electrodes THV4 that pass through one through hole 410H may be improved.

The number of through electrodes THV4 passing through the insulating structure 470 and the through hole 410H is not limited to the example shown in FIGS. 11 and 12, and the number and size of through electrodes THV4 may be variously changed within the scope of the inventive concept.

Figure 13:
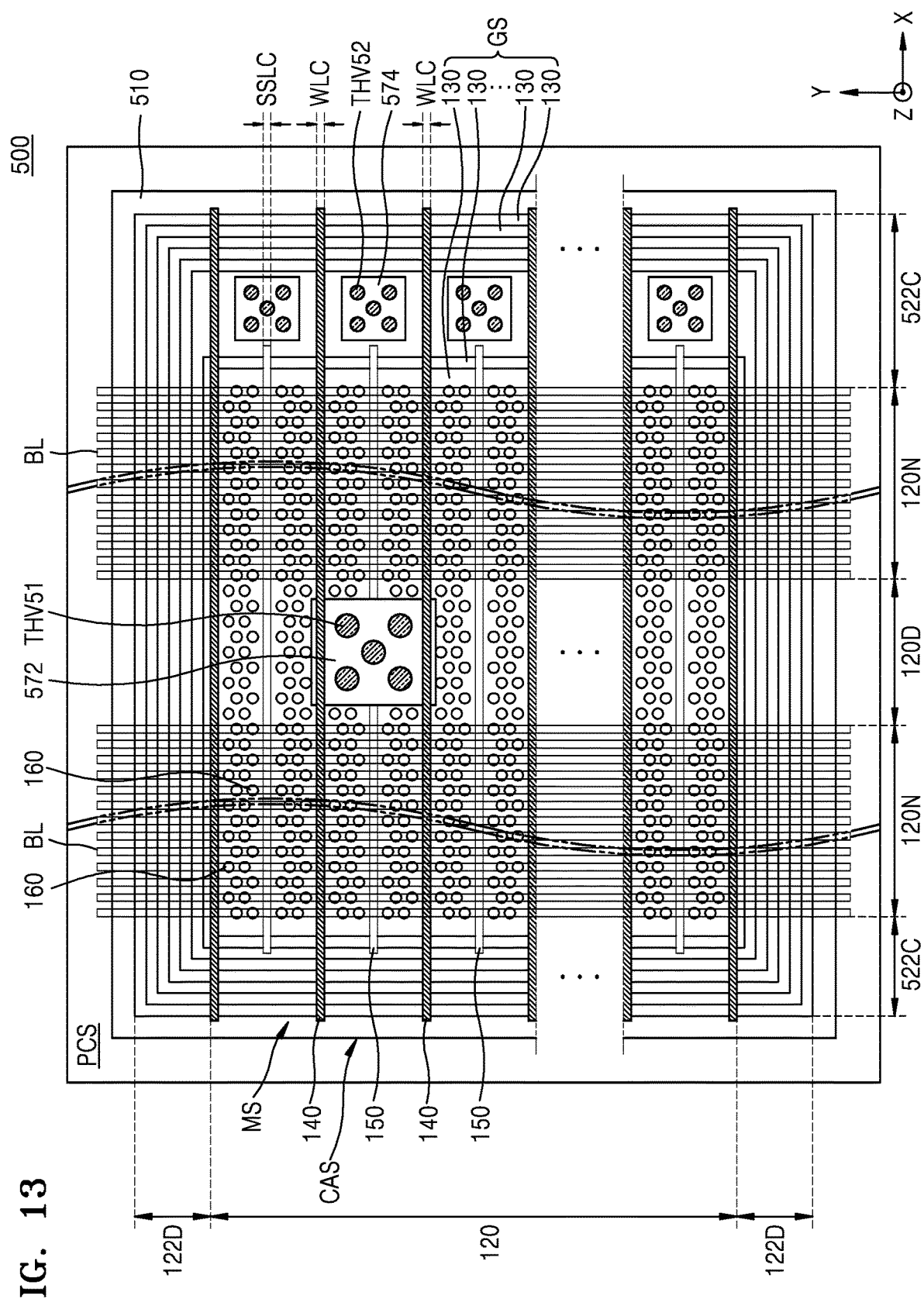
FIG. 13 is a plan view of an IC device according to an embodiment.
Figure 14:
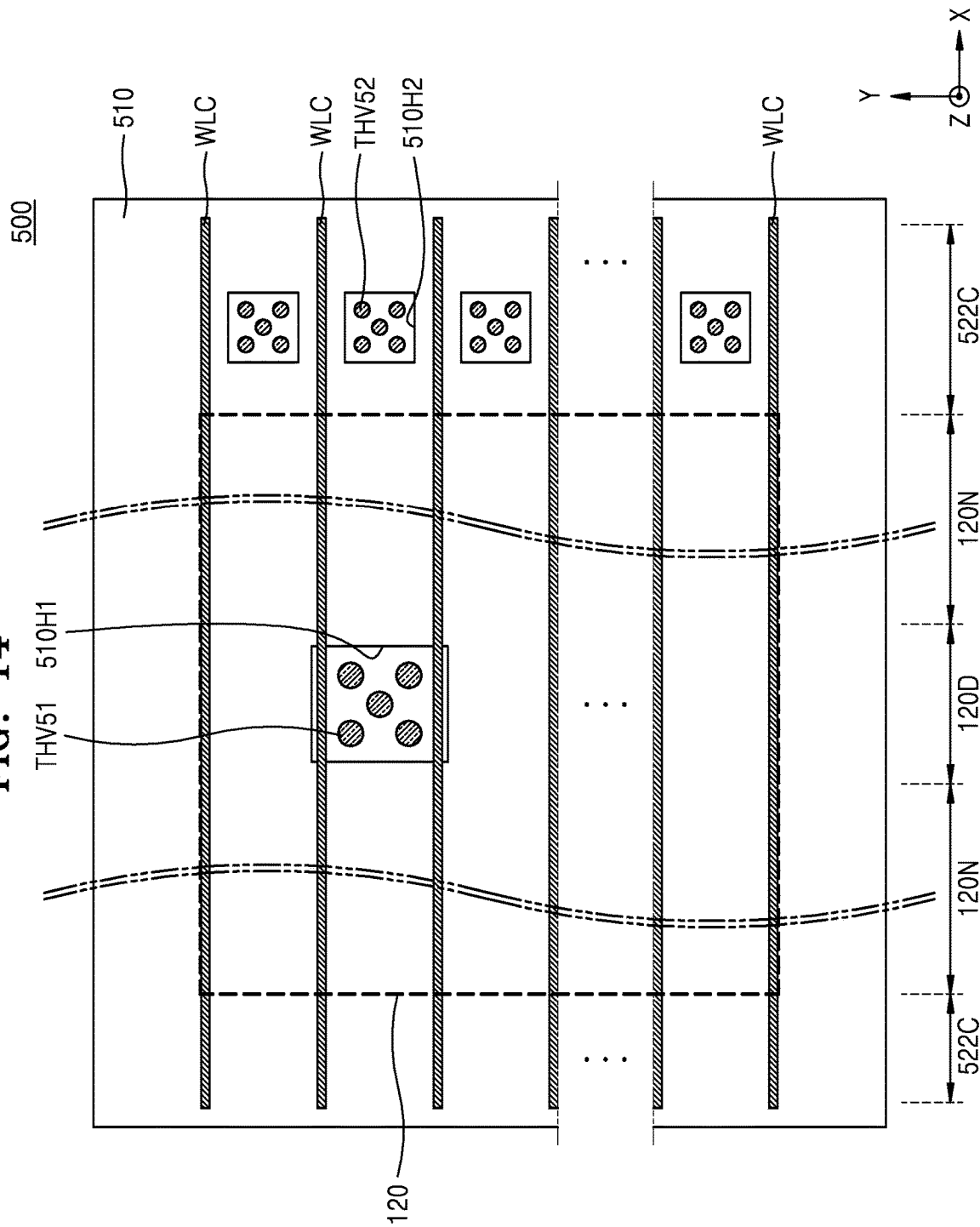
FIG. 14 is a plan view of some components of the IC device shown in FIG. 13.

FIG. 13 is a plan view of an IC device 500 according to an embodiment. FIG. 14 is a plan view of the upper substrate 110, the plurality of word line cut regions WLC, the plurality of first through electrodes THV51, and the plurality of first through electrodes THV52 of the IC device 300 shown in FIG. 13.

Referring to FIGS. 13 and 14, the IC device 500 may have substantially the same configuration as the IC device 100A described with reference to FIGS. 6 and 7. However, the IC device 500 may include a pair of connection stepped regions 522C, which are located on opposite sides of a memory cell region 120 in a first lateral direction (X direction).

A first through hole 510H1 may be formed in an upper substrate 510 at a position facing a dummy cell region 120D of the memory cell region 120. A plurality of second through holes 510H2 may be formed in the upper substrate 510 in at least one of the pair of connection stepped regions 522C. Although FIGS. 13 and 14 illustrate an example in which the plurality of second through holes 510H2 are formed in only one of the pair of connection stepped regions 522C, the inventive concept is not limited thereto, and a plurality of second through holes 510H2 may be formed in each of the pair of connection stepped regions 522C.

A first insulating structure 572 may be located on the upper substrate 510 at a position overlapping the first through hole 510H1 in a vertical direction (Z direction), and a second insulating structure 574 may be located at each of a plurality of positions overlapping the plurality of second through holes 510H2 in the vertical direction (Z direction). In example embodiments, the upper substrate 510, the first insulating structure 572, and the second insulating structure 574 may have the same configurations as the upper substrate 110 and the insulating structure 170 described with reference to FIGS. 4 and 5A to 5C. In other example embodiments, each of the first insulating structure 572 and the second insulating structure 574 may have the same configuration as the insulating structure 270 described with reference to FIG. 8.

The IC device 500 may include a plurality of first through electrodes THV51, which pass through a plurality of gate lines 130 in the dummy cell region 120D, penetrate the upper substrate 510 through the first through hole 510H1, and extend long into a peripheral circuit structure PCS in the vertical direction (Z direction). Also, the IC device 500 may include a plurality of second through electrodes THV52, which pass through the plurality of gate lines 130 in the connection stepped region 522C, penetrate the upper substrate 510 through the second through hole 510H2, and extend lengthwise into the peripheral circuit structure PCS in the vertical direction (Z direction).

Each of the plurality of first through electrodes THV51 may be surrounded by the first insulating structure 572 in a cell array structure CAS. Each of the plurality of second through electrodes THV52 may be surrounded by the second insulating structure 574 in the connection stepped region 522C. Similarly to the through electrode THV shown in FIG. 5B, each of the plurality of first through electrodes THV51 and the plurality of second through electrodes THV52 may be connected to at least one of a plurality of circuits CT through a peripheral circuit interconnection layer ML66 included in the peripheral circuit structure PCS.

The number of first through electrodes THV51 passing through one first through hole 510H1 is not limited to the example shown in FIGS. 13 and 14, and the number and size of first through electrodes THV51 may be variously changed within the scope of the inventive concept.

According to the IC devices 100, 100A, 200, 300, 400, and 500 described with reference to FIGS. 4 to 14, in the IC device having the COP structure, even if the number of stages of the gate lines 130 included in a memory stack MS stacked on the peripheral circuit structure PCS is increased and a height of the memory stack MS is increased, it may be easy to ensure a stable separation distance greater than or equal to a minimum separation distance required by the design rules between the upper substrate 110, which is interposed between the peripheral circuit structure PCS and the memory stack MS, and the through electrodes THV, THV3, or THV4, which pass through the memory stack MS and the upper substrate 110 and extend into the peripheral circuit structure PCS, or between the upper substrate 510 and the first through electrodes THV51, which pass through the memory stack MS and the upper substrate 510 and extend into the peripheral circuit structure PCS, a degree of freedom for layout design of the through electrodes THV, THV3, THV4, or THV51, which pass through the upper substrate 110 or 510, may be improved. Accordingly, the integration density of the IC device having the COP structure may be improved, a chip size may be reduced, and the reliability of the IC device may be improved.

As can be seen, the through electrodes THV, THV3, THV4, and THV51 described herein have structures where a continuous material extends from a bottom of the through electrodes (e.g., where they connect to and contact a conductive layer within peripheral circuit structure), to a top of the through electrodes (e.g., where they connect to a component above and outside of the cell array structure). These through electrodes may have continuous sidewalls from a bottom to top, and may be formed of a single integrated structure.

FIGS. 15A to 19A and 15B to 19B are cross-sectional views illustrating a process sequence of a method of manufacturing an IC device according to an embodiment. Specifically, FIGS. 15A-19A are cross-sectional views of some components according to the process sequence in a portion corresponding to a cross-section taken along a line X1-X1' of FIG. 4. FIGS. 15B-19B are cross-sectional views of some components according to the process sequence in the portion corresponding to a cross-section taken along a line Y1-Y1' of FIG. 4. In the present embodiment, a method of manufacturing the IC device 100 shown in FIGS. 4 and 5A to 5C will be described as an example.

Figure 15A:
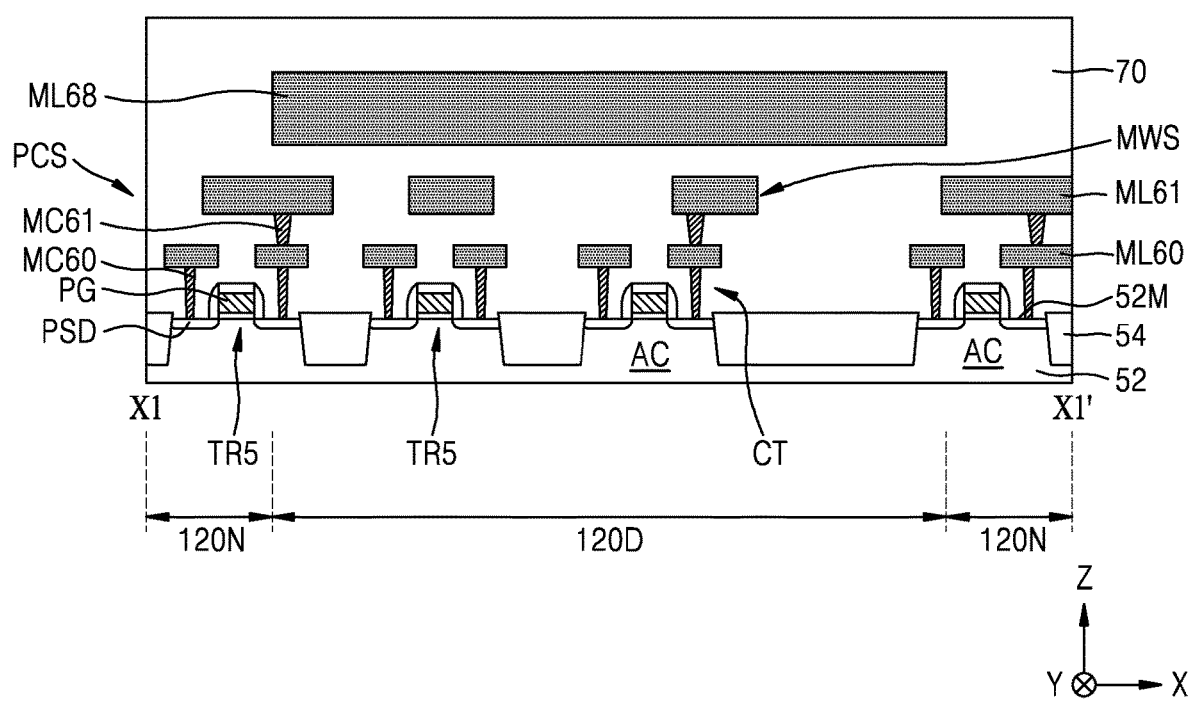
Figure 15B:
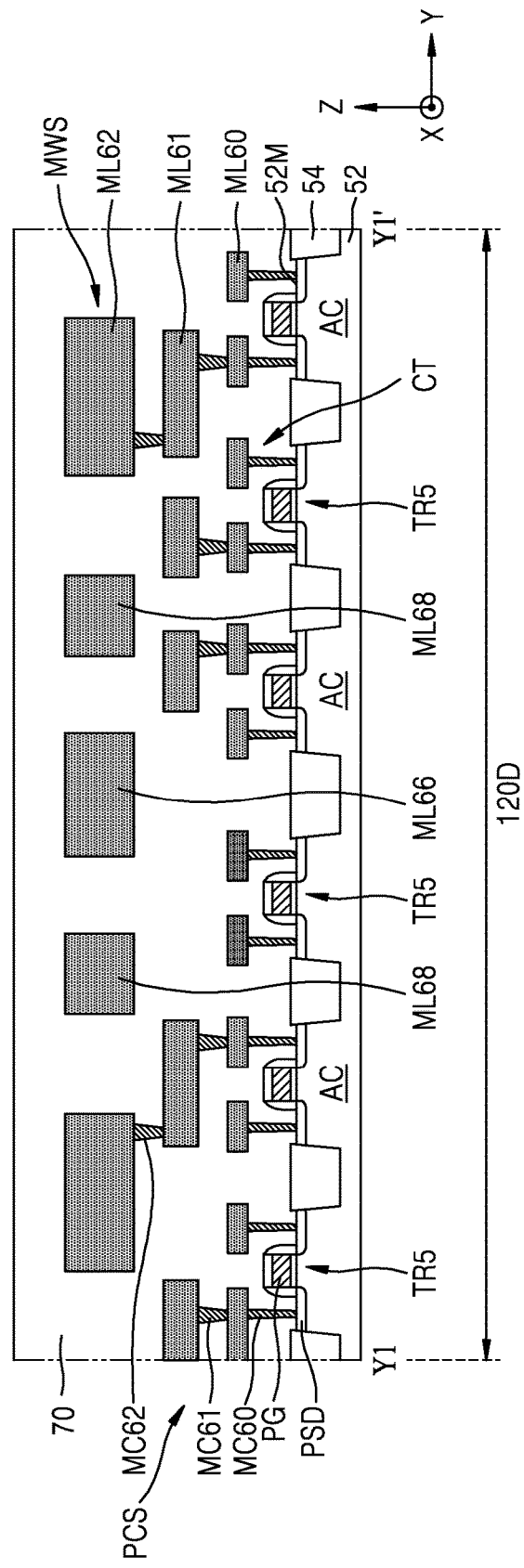

Referring to FIGS. 15A and 15B, a peripheral circuit structure PCS including a lower substrate 52, a plurality of circuits CT, a multilayered interconnection structure MWS, and an interlayer insulating film 70 are formed.

The multilayered interconnection structure MWS may include a plurality of peripheral circuit interconnection layers (e.g., ML60, ML61, ML62, and ML66) and a floating interconnection layer ML68, which is formed at the same level as uppermost peripheral circuit interconnection layers ML62 and ML66, which are closest to an upper substrate 110 from among the peripheral circuit interconnection layers ML60, ML61, ML62, and ML66. Each of these layers may be part of the same vertical layer of the multilayered interconnection structure MWS. For example, they may be formed as a unitary layer (e.g., a layer having a uniform material and formed during the same process at the same vertical level).

Figure 16A:
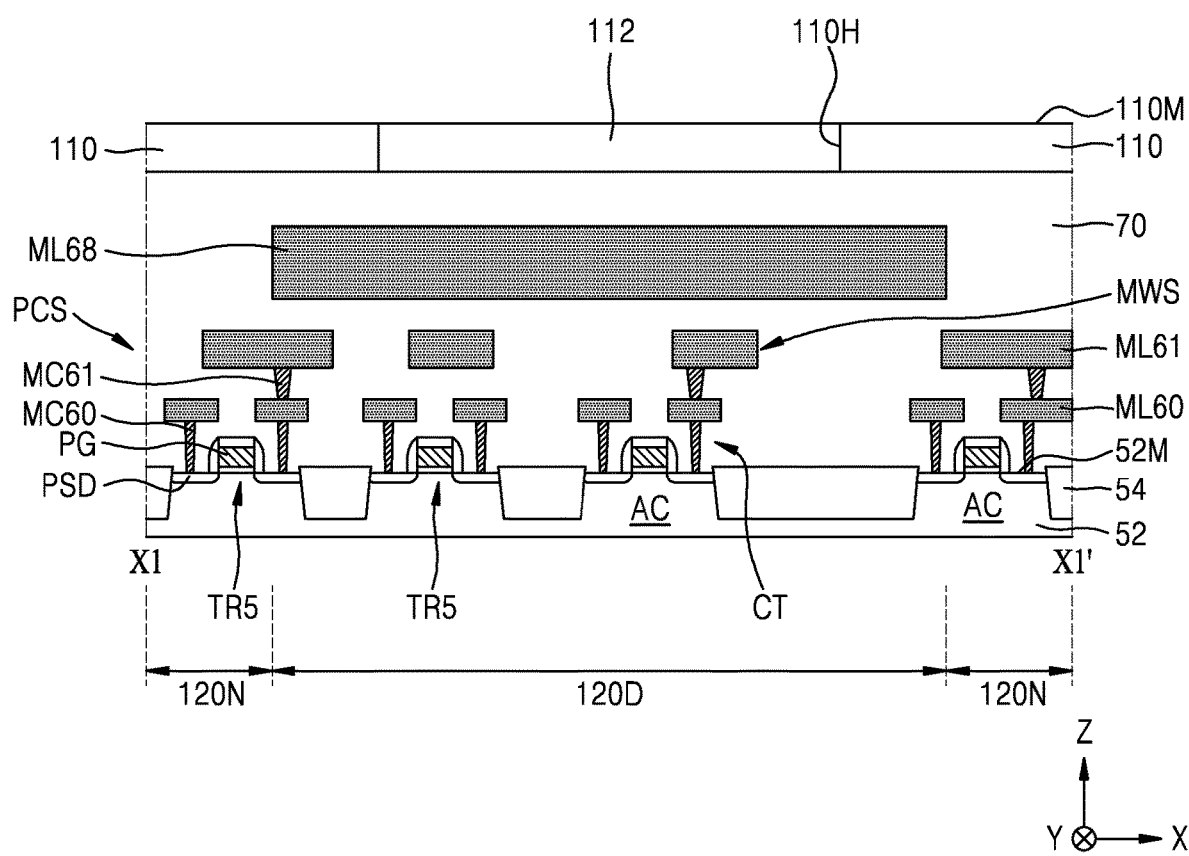
Figure 16B:
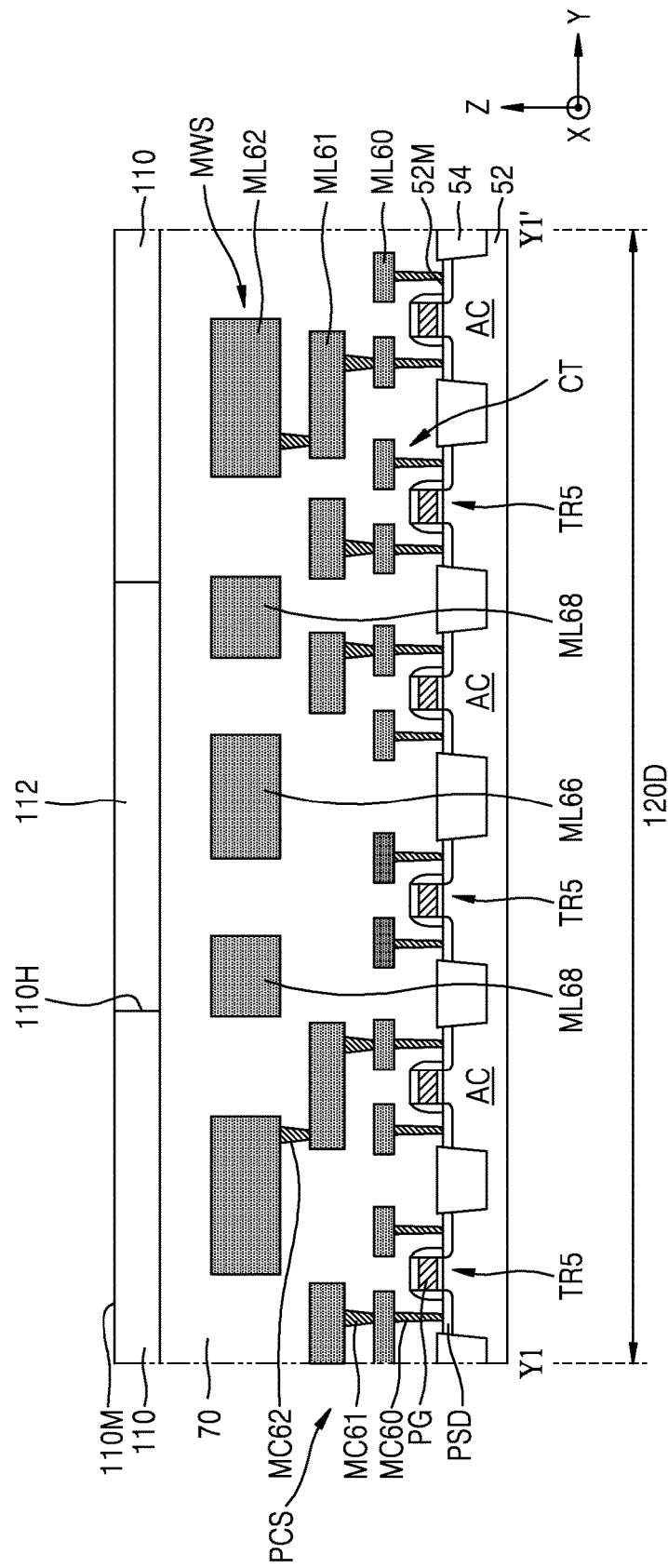

Referring to FIGS. 16A and 16B, the upper substrate 110 may be formed on the peripheral circuit structure PCS. A through hole 110H may be formed in the upper substrate 110, and a buried insulating film 112 may be formed to fill the through hole 110H.

Figure 17A:
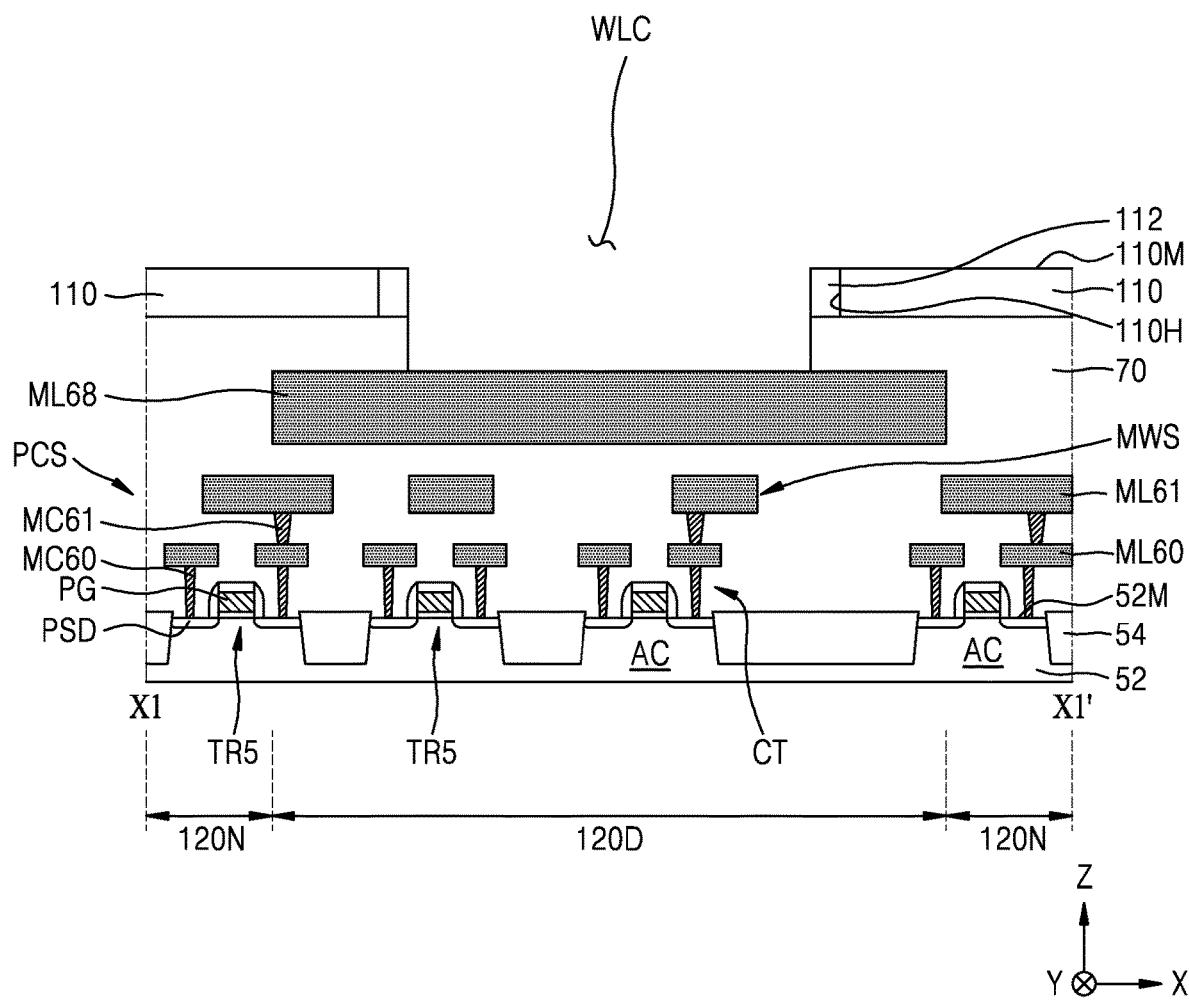
Figure 17B:
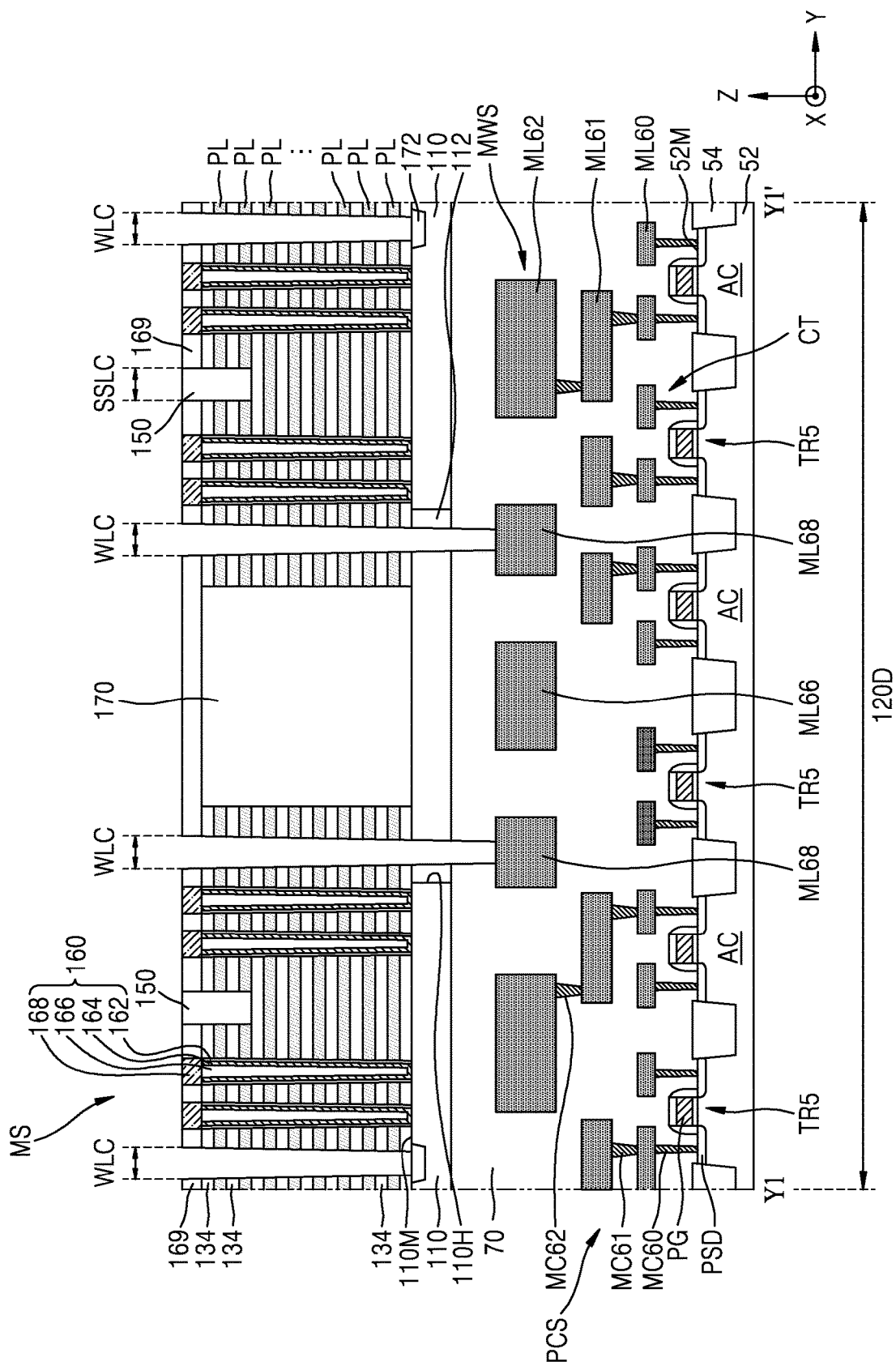

Referring to FIGS. 17A and 17B, a plurality of insulating films 134 and a plurality of sacrificial films PL may be alternately stacked one by one on the upper substrate 110 and the buried insulating film 112. The plurality of sacrificial films PL may include silicon nitride, silicon carbide, or polysilicon. The plurality of sacrificial films PL may respectively ensure spaces for forming a plurality of gate lines 130 during a subsequent process.

Subsequently, a portion of each of the plurality of insulating films 134 and a portion of each of the plurality of sacrificial films PL may be replaced by an insulating structure 170, and an upper insulating film 169 may be formed. The upper insulating film 169 may be formed to cover an uppermost insulating film 134 of the plurality of insulating films 134 and the insulating structure 170. Thereafter, a plurality of channel structures 160 may be formed to pass through the upper insulating film 169, the plurality of insulating films 134, and the plurality of sacrificial films PL, and a string selection line cut region SSLC and an insulating film 150 filling the string selection line cut region SSLC may be formed.

Afterwards, a plurality of word line cut regions WLC may be formed to pass through the upper insulating film 169, the plurality of insulating films 134, and the plurality of sacrificial films PL. A portion of the plurality of word line cut regions WLC may pass through the buried insulating film 112, which fills the through hole 110H, and a portion of the interlayer insulating film 70 of the peripheral circuit structure PCS. A top surface of the upper substrate 110 and a top surface of the floating interconnection layer ML68 may be exposed through the plurality of word line cut regions WLC. Dopant ions may be implanted into portions of the upper substrate 110, which are exposed through the plurality of word line cut regions WLC, to form a plurality of common source regions 172.

Figure 18A:
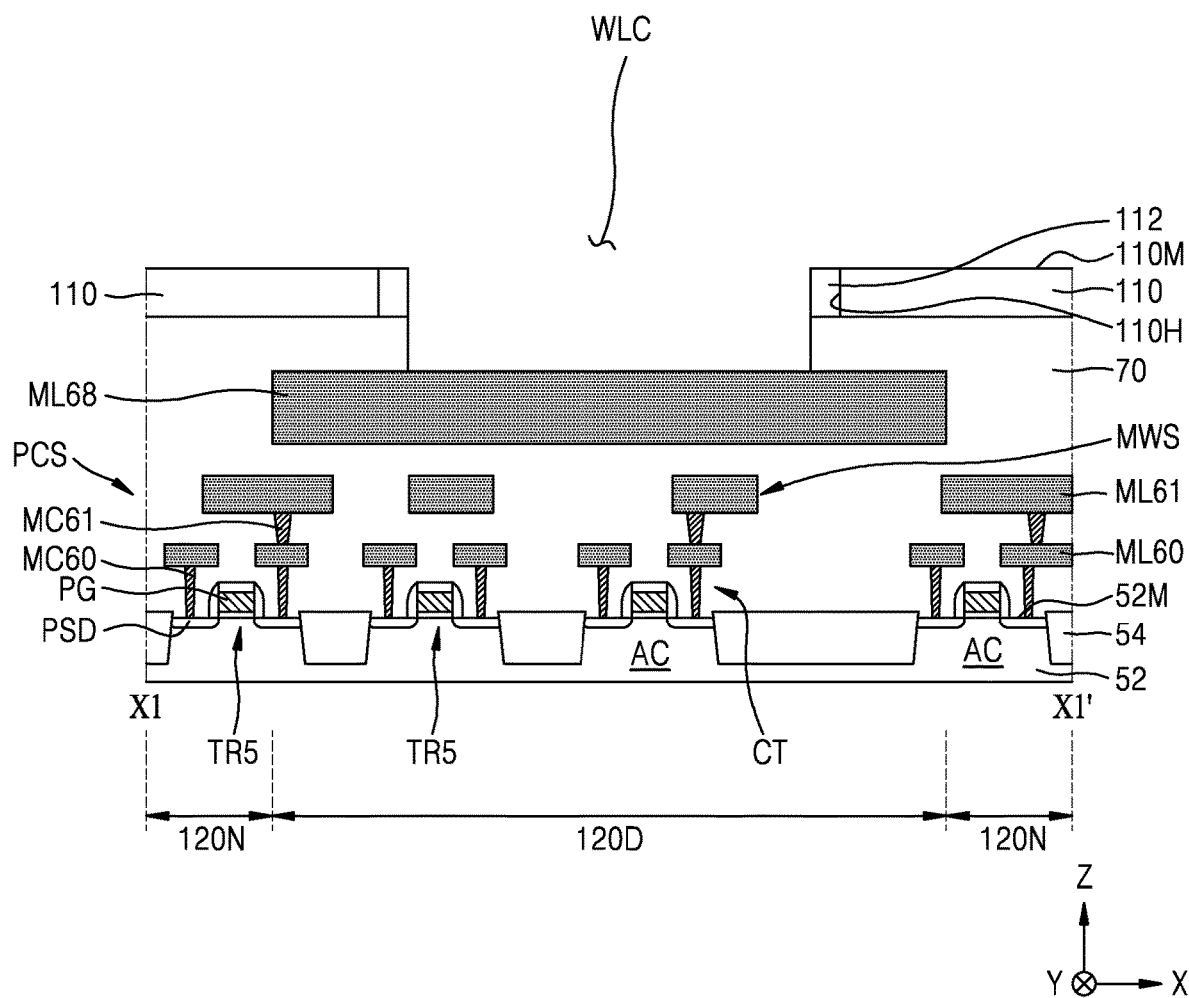
Figure 18B:
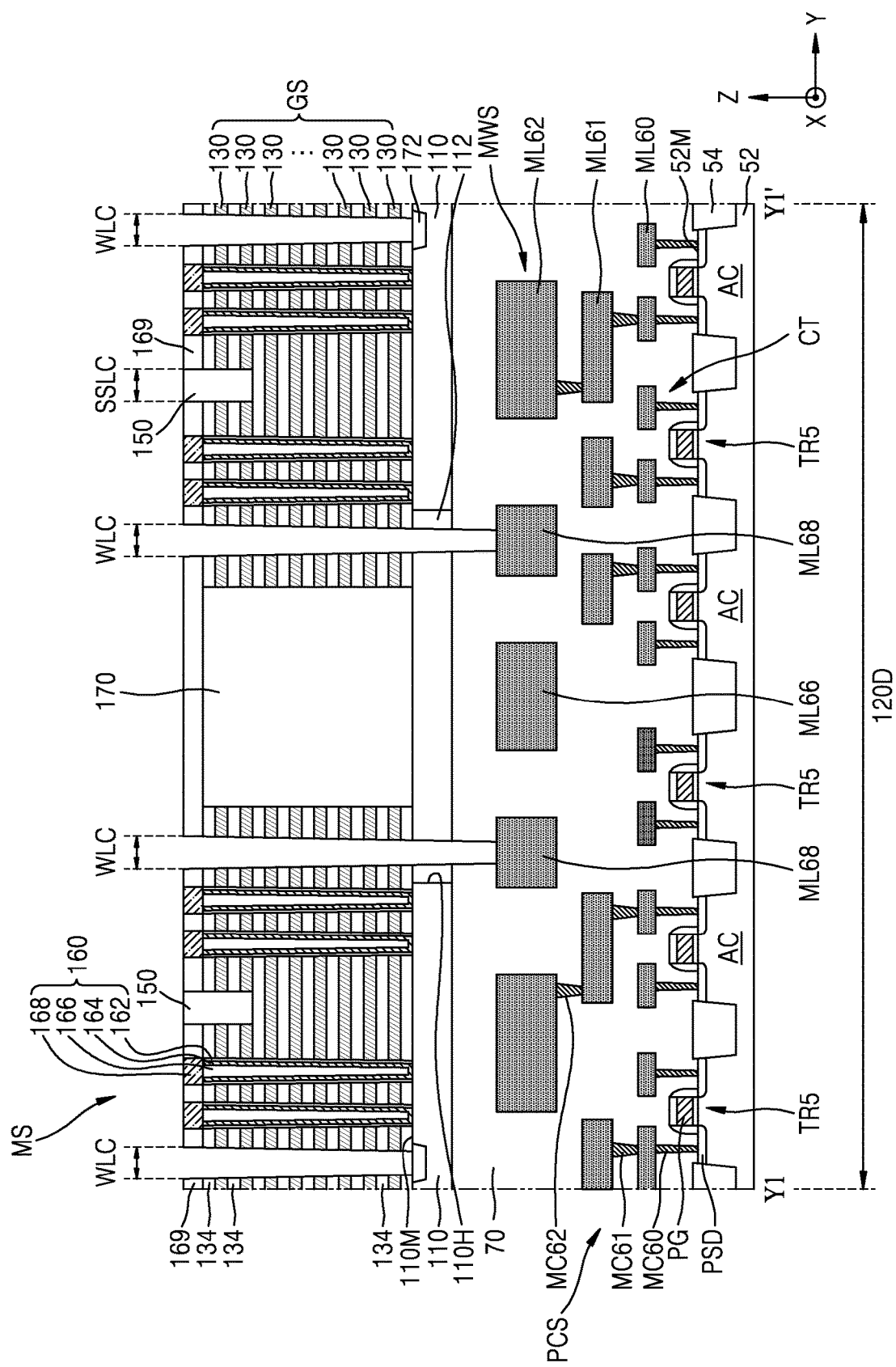

Referring to FIGS. 18A and 18B, the plurality of sacrificial films PL may be replaced by the plurality of gate lines 130 using the plurality of word line cut regions WLC in the resultant structure of FIGS. 17A and 17B. In some embodiments, to replace the plurality of sacrificial films PL (refer to FIG. 17B) by the plurality of gate lines 130, the plurality of sacrificial films PL exposed through the plurality of word line cut regions WLC may be selectively removed to prepare vacant spaces between the respective insulating films 134, and the vacant spaces may be filled with a conductive material to form the plurality of gate lines 130.

Figure 19A:
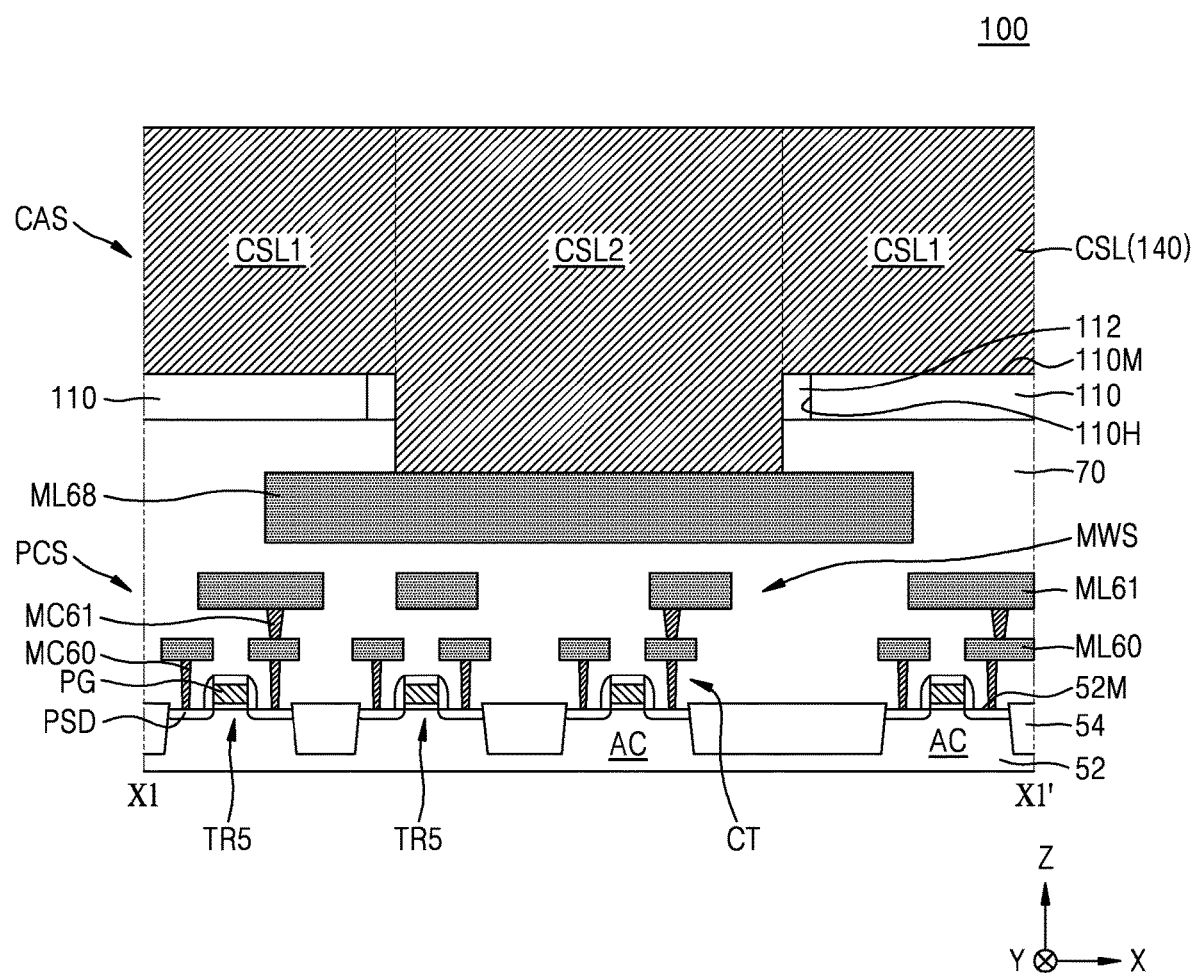
Figure 19B:
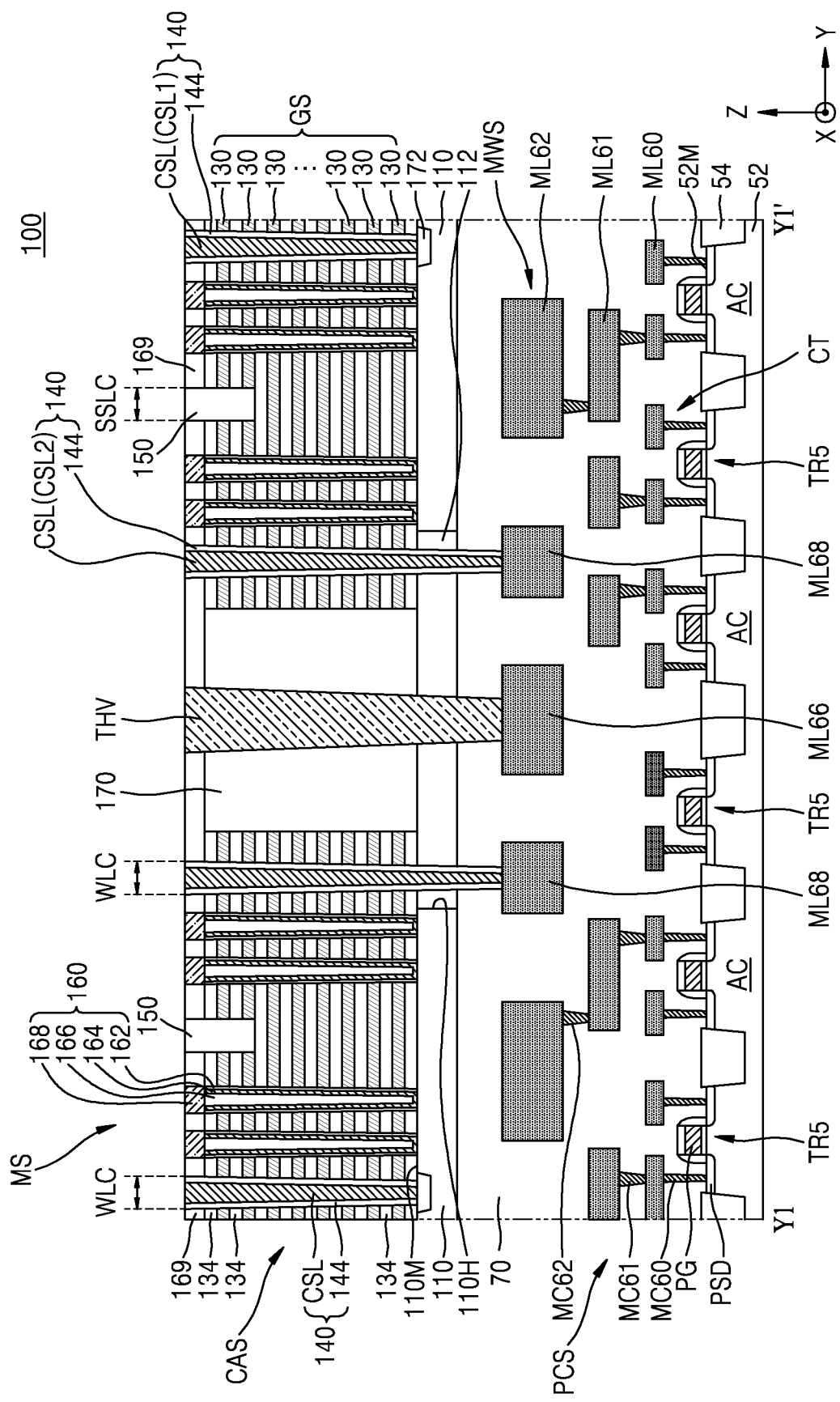

Referring to FIGS. 19A and 19B, a common source line structure 140 including insulating spacers 144 and a common source line CSL may be formed in each of the plurality of word line cut regions WLC. A plurality of through electrodes THV may be formed to pass through the upper insulating film 169, the insulating structure 170, the buried insulating film 112, and the interlayer insulating film 70 and to contact a top surface of the peripheral circuit interconnection layer ML66.

Thereafter, a plurality of bit lines BL may be formed on the plurality of channel structures 160 to manufacture the IC device 100 shown in FIGS. 4 and 5A to 5C. Also, additional lines may be formed above a top surface of the cell array structure CAS to electrically connect to the through electrodes THV.

The IC device 200 shown in FIG. 8 may be manufactured using a method similar to the method of manufacturing the IC device 100, which is described with reference to FIGS. 15A to 19B. However, a process of forming the insulating structure 170 may be omitted from the process described with reference to FIGS. 17A and 17B. Also, when the plurality of sacrificial films PL (refer to FIG. 17B) are replaced by the plurality of gate lines 130 in the process described with reference to FIGS. 18A and 18B, some of the plurality of sacrificial films PL may be left without being replaced by the plurality of gate lines 130 As a result, an insulating structure 270 having a multilayered structure including some of the plurality of sacrificial films PL and some of the plurality of insulating films 134 may be obtained. In this case, the plurality of first insulating films 272 shown in FIG. 8 may be the resultant structures obtained using some of the plurality of insulating films 134, and a plurality of second insulating films 274 shown in FIG. 8 may be the resultant structures obtained using some of the plurality of sacrificial films PL.

Although the IC device 100 shown in FIGS. 4 and 5A to 5C and the method of manufacturing the IC device 200 shown in FIG. 8 have been described with reference to FIGS. 15A to 19B, it will be understood that the IC devices 100A, 300, 400, and 500 shown in FIGS. 6, 7, and 9 to 14 and IC devices having variously modified and changed structures may be manufactured by applying various modifications and changes within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a peripheral circuit structure;
   a memory stack comprising a plurality of gate lines overlapping the peripheral circuit structure in a vertical direction on the peripheral circuit structure;
   an upper substrate between the peripheral circuit structure and the memory stack, the upper substrate comprising a through hole positioned below a memory cell region of the memory stack;
   a word line cut region extending lengthwise in a first lateral direction across the memory stack and the through hole; and
   a common source line located in the word line cut region, the common source line comprising a first portion extending lengthwise in the first lateral direction on the upper substrate and a second portion integrally connected to the first portion, the second portion penetrating the upper substrate through the through hole from an upper portion of the upper substrate and extending into the peripheral circuit structure.

2. The integrated circuit device of claim 1, wherein
   the peripheral circuit structure comprises a plurality of peripheral circuit conductive interconnection layers and a floating conductive interconnection layer, which is laterally spaced apart from the plurality of peripheral circuit conductive interconnection layers and is connected to the common source line.

3. The integrated circuit device of claim 1, wherein the peripheral circuit structure comprises:
   a lower substrate;
   a plurality of circuits formed on the lower substrate;
   a plurality of peripheral circuit conductive interconnection layers connected to the plurality of circuits; and
   a floating conductive interconnection layer formed at the same vertical level as an uppermost peripheral circuit conductive interconnection layer, which is closest to the upper substrate from among the plurality of peripheral circuit conductive interconnection layers, wherein the floating conductive interconnection layer contacts the common source line.

4. The integrated circuit device of claim 1, further comprising a through electrode passing through the plurality of gate lines and the upper substrate and extending lengthwise into the peripheral circuit structure in the vertical direction.

5. The integrated circuit device of claim 1, further comprising:
   an insulating structure arranged on the upper substrate, the insulating structure passing through the plurality of gate lines in the memory cell region and extending in the vertical direction;
   a buried insulating film filling the through hole; and
   a through electrode passing through the insulating structure and the buried insulating film and extending lengthwise into the peripheral circuit structure in the vertical direction.

6. The integrated circuit device of claim 1, wherein
   the memory cell region comprises a normal cell region and a dummy cell region,
   wherein the through hole is positioned below the dummy cell region.

7. The integrated circuit device of claim 1, further comprising a plurality of through electrodes passing through the plurality of gate lines in the memory cell region and extending lengthwise in the vertical direction,
   wherein each of the plurality of through electrodes penetrates the upper substrate through the through hole and is connected to a multilayered interconnection structure of the peripheral circuit structure.

8. The integrated circuit device of claim 1, wherein the peripheral circuit structure comprises:
a lower substrate;
a plurality of circuits formed on the lower substrate;
a plurality of peripheral circuit conductive interconnection layers connected to the plurality of circuits; and
a floating conductive interconnection layer formed at the same vertical level as an uppermost peripheral circuit conductive interconnection layer, which is closest to the upper substrate from among the plurality of peripheral circuit conductive interconnection layers, wherein the floating conductive interconnection layer contacts the second portion of the common source line,
wherein the floating conductive interconnection layer has the same electrical bias as the common source line.

9. The integrated circuit device of claim 1, further comprising a through electrode penetrating the upper substrate through the through hole in the memory cell region and being connected to a multilayered interconnection structure of the peripheral circuit structure,
wherein a separation distance between the through electrode and the upper substrate is between 0.01 μm and 1.5 μm.

10. The integrated circuit device of claim 1, wherein the first portion overlaps with the upper substrate in the vertical direction,
wherein a length of the second portion is greater than a length of the first portion in the vertical direction.

11. An integrated circuit device comprising:
a peripheral circuit structure comprising a plurality of circuits, a plurality of peripheral circuit conductive interconnection layers connected to the plurality of circuits, and a floating conductive interconnection layer laterally spaced apart from the plurality of peripheral circuit conductive interconnection layers;
an upper substrate located on the peripheral circuit structure, the upper substrate comprising a first through hole formed at a position overlapping the floating conductive interconnection layer in a vertical direction;
a memory stack having a memory cell region covering the first through hole and a connection stepped region located at one side of the memory cell region, the memory stack comprising a plurality of gate lines spaced apart from the peripheral circuit structure with the upper substrate therebetween in the vertical direction;
a plurality of word line cut regions extending lengthwise in a first lateral direction across the memory stack and the first through hole, the plurality of word line cut regions each comprising a portion penetrating the upper substrate through the first through hole in the vertical direction; and
a plurality of first through electrodes penetrating the plurality of gate lines in the vertical direction in the memory cell region and extending to the plurality of peripheral circuit conductive interconnection layers through the first through hole.

12. The integrated circuit device of claim 11, wherein the plurality of first through electrodes comprise two first through electrodes, which are laterally spaced apart from each other with one selected out of the plurality of word line cut regions therebetween.

13. The integrated circuit device of claim 11, further comprising a plurality of common source lines respectively arranged inside the plurality of word line cut regions,
wherein each of the plurality of common source lines comprises a first portion and a second portion, the first portion extending lengthwise in the first lateral direction on the upper substrate, the second portion being integrally connected to the first portion and extending from an upper portion of the upper substrate through the first through hole to the floating conductive interconnection layer.

14. The integrated circuit device of claim 13, wherein the second portion has a greater length than the first portion in the vertical direction.

15. The integrated circuit device of claim 11, wherein the upper substrate is not interposed laterally between any two first through electrodes of the plurality of first through electrodes.

16. The integrated circuit device of claim 11, further comprising:
a second through hole formed at a position within the connection stepped region in the upper substrate; and
at least one second through electrode penetrating the upper substrate through the second through hole in the vertical direction and extending to at least one peripheral circuit conductive interconnection layer selected out of the plurality of peripheral circuit conductive interconnection layers.

17. The integrated circuit device of claim 11, further comprising:
an insulating structure passing through the plurality of gate lines in the memory cell region and extending in the vertical direction; and
a buried insulating film filling the first through hole,
wherein the plurality of first through electrodes pass through the insulating structure and the buried insulating film in the vertical direction and extend to the plurality of peripheral circuit conductive interconnection layers.

18. An integrated circuit device comprising:
a peripheral circuit structure comprising a lower substrate, and a plurality of peripheral circuit conductive interconnection layers and a floating conductive interconnection layer, which are formed on the lower substrate;
a memory cell region comprising a plurality of gate lines arranged on the peripheral circuit structure;
an upper substrate between the peripheral circuit structure and the memory cell region and comprising a through hole formed at a position within the memory cell region;
a common source line comprising a first portion and a second portion, the first portion extending lengthwise in a first lateral direction across the memory cell region and the through hole, the first portion contacting the upper substrate, the second portion being integrally connected to the first portion and extending from an upper portion of the upper substrate through the through hole to the floating conductive interconnection layer;
an insulating structure passing through the plurality of gate lines in the memory cell region and extending in a vertical direction;
a buried insulating film filling the through hole; and
at least one through electrode passing through the insulating structure and the buried insulating film and extending lengthwise in the vertical direction to at least one peripheral circuit conductive interconnection layer selected from the plurality of peripheral circuit conductive interconnection layers.

19. The integrated circuit device of claim 18, wherein the at least one peripheral circuit conductive interconnection layer and the floating conductive interconnection layer extend in a lateral direction at the same vertical level on the lower substrate, wherein the floating conductive interconnection layer is configured to have the same electrical bias as the common source line.

20. The integrated circuit device of claim 18, wherein the at least one through electrode comprises two through electrodes, which are laterally spaced apart from each other with the common source line therebetween and extend lengthwise in the vertical direction through the through hole, wherein the upper substrate is not interposed laterally between the two through electrodes.

* * * * *